United States Patent
Nishimura

(10) Patent No.: US 9,646,836 B2
(45) Date of Patent: May 9, 2017

(54) SEMICONDUCTOR DEVICE MANUFACTURING METHOD

(71) Applicant: FUJI ELECTRIC CO., LTD., Kawasaki-shi (JP)

(72) Inventor: Takeyoshi Nishimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/719,409

(22) Filed: May 22, 2015

(65) Prior Publication Data

US 2016/0020101 A1    Jan. 21, 2016

(30) Foreign Application Priority Data

Jul. 15, 2014    (JP) ................................ 2014-145468

(51) Int. Cl.
  *H01L 21/332*    (2006.01)
  *H01L 21/225*    (2006.01)
  *H01L 29/66*    (2006.01)

(52) U.S. Cl.
  CPC .... *H01L 21/2253* (2013.01); *H01L 29/66333* (2013.01)

(58) Field of Classification Search
  CPC .................................................... H01L 21/304
  USPC ........................................................ 438/138
  See application file for complete search history.

(56) References Cited

U.S. PATENT DOCUMENTS

| | | | |
|---|---|---|---|
| 2004/0043565 A1* | 3/2004 | Yamaguchi | H01L 29/0634 438/268 |
| 2005/0006717 A1* | 1/2005 | Yamaguchi | H01L 29/0634 257/500 |
| 2005/0035371 A1* | 2/2005 | Fujihira | H01L 29/0619 257/200 |
| 2011/0233656 A1* | 9/2011 | Ohta | H01L 29/0634 257/329 |
| 2011/0287617 A1 | 11/2011 | Kodama | |

(Continued)

FOREIGN PATENT DOCUMENTS

| | | |
|---|---|---|
| JP | 2000-040822 A | 2/2000 |
| JP | 2008-283112 A | 11/2008 |

(Continued)

*Primary Examiner* — Igwe U Anya
(74) *Attorney, Agent, or Firm* — Rabin & Berdo, P.C.

(57) ABSTRACT

Provided is a semiconductor device manufacturing method such that miniaturization of a parallel p-n layer can be achieved, and on-state resistance can be reduced. Firstly, deposition of an $n^-$-type epitaxial layer, and formation of an n-type impurity region and p-type impurity region that form an n-type region and p-type region of a parallel p-n layer, are repeatedly carried out. Furthermore, an $n^-$-type counter region is formed in the vicinity of the p-type impurity region in the uppermost $n^-$-type epitaxial layer forming the parallel p-n layer. Next, an $n^-$-type epitaxial layer is deposited on the $n^-$-type epitaxial layer. Next, a MOS gate structure is formed in the $n^-$-type epitaxial layer. At this time, when carrying out a p-type base region diffusion process, the n-type and p-type impurity regions are caused to diffuse, thereby forming the n-type region and p-type region of the parallel p-n layer.

18 Claims, 24 Drawing Sheets

(56) References Cited

U.S. PATENT DOCUMENTS

| | | | | |
|---|---|---|---|---|
| 2012/0061721 A1* | 3/2012 | Kimura | ............... | H01L 29/0634 |
| | | | | 257/133 |
| 2013/0026560 A1* | 1/2013 | Onishi | ................ | H01L 29/0634 |
| | | | | 257/329 |
| 2013/0126967 A1* | 5/2013 | Toyoda | ........... | H01L 21/823481 |
| | | | | 257/334 |
| 2014/0284715 A1* | 9/2014 | Fukuda | ............. | H01L 29/66712 |
| | | | | 257/339 |

FOREIGN PATENT DOCUMENTS

| | | |
|---|---|---|
| JP | 2011-192824 A | 9/2011 |
| JP | 2011-243865 A | 12/2011 |

* cited by examiner

FIG. 8

| | n-TYPE REGION | | p-TYPE REGION | |
|---|---|---|---|---|
| | IMPURITY CONCENTRATION [/cm³] | THICKNESS [µm] | IMPURITY CONCENTRATION [/cm³] | THICKNESS [µm] |
| SJ1 | $4.90 \times 10^{16}$ | 1.8 | $4.60 \times 10^{16}$ | 1.8 |
| SJ2 | $6.00 \times 10^{16}$ | 1.6 | $5.60 \times 10^{16}$ | 1.6 |
| SJ3 | $6.00 \times 10^{16}$ | 2.0 | $5.50 \times 10^{16}$ | 2.0 |

SEMICONDUCTOR DEVICE MANUFACTURING METHOD

CROSS-REFERENCE TO RELATED APPLICATION

This application claims the benefit of foreign priority of Japanese patent application number 2014-145468, filed on Jul. 15, 2014, the disclosure of which is incorporated herein by reference.

BACKGROUND OF THE INVENTION

1. Field of the Invention

The present invention relates to a semiconductor device manufacturing method.

2. Description of the Background Art

A semiconductor device including a superjunction (SJ) structure (hereafter referred to as a superjunction semiconductor device), having as a drift layer a parallel p-n layer wherein an n-type region, in which the impurity concentration is increased, and a p-type region are repeatedly alternately disposed in a direction (hereafter taken to be a horizontal direction) parallel to a substrate main surface, is commonly known. A superjunction structure has a function of relaxing an electrical field applied in the vicinity of a p-n junction between a base region and the drift layer, thus considerably reducing drift resistance. In recent years, use of this superjunction semiconductor device has spread from the medium and high breakdown voltage class, wherein the ratio of drift resistance with respect to the on-state resistance (on-state voltage) is high owing to the drift layer being thick, to the low breakdown voltage class. Next, a description will be given of the structure of an existing superjunction semiconductor device, with a trench gate superjunction semiconductor device as an example.

FIG. 18 is a sectional view of the structure of an existing superjunction semiconductor device. The superjunction semiconductor device shown in FIG. 18 includes a parallel p-n layer 105 on the front surface of an n$^+$-type (or p$^+$-type) semiconductor substrate 101. The n$^+$-type semiconductor substrate 101 forms, for example, an n$^+$-type drain layer, on which a metal-oxide-semiconductor field effect transistor (MOSFET) is configured as the superjunction semiconductor device of FIG. 18. The p$^+$-type semiconductor substrate 101 forms, for example, a p$^+$-type collector layer, on which an insulated gate bipolar transistor (IGBT) is configured as the superjunction semiconductor device of FIG. 18.

The parallel p-n layer 105 is formed by an n-type region 103 and p-type region 104 being repeatedly alternately disposed in a horizontal direction. The parallel p-n layer 105 is provided inside multiple levels of epitaxial layer stacked on the semiconductor substrate 101. Also, the parallel p-n layer 105 is provided in the substrate depth direction (hereafter taken to be a vertical direction) from the front surface side of an epitaxial substrate (semiconductor chip) formed of the semiconductor substrate 101 and multiple levels of epitaxial layer, across the multiple levels of epitaxial layer to a depth not reaching the semiconductor substrate 101. A unit cell (functional unit of an element) including a general trench gate MOS gate (an insulated gate formed of metal-oxide-semiconductor) structure is provided on the parallel p-n layer 105 (the front surface side of the epitaxial substrate).

The MOS gate structure is formed of a trench 106, a gate dielectric 107, a gate electrode 108, a p-type base region 109, and an n$^+$-type source region (or n$^+$-type emitter region) 110. The p-type base region 109 is disposed so as to oppose the p-type region 104 of the parallel p-n layer 105 in a vertical direction, and in contact with the p-type region 104, in order to prevent a decrease in breakdown voltage. A front surface electrode 112 that forms a source electrode (or emitter electrode) is in contact with the p-type base region 109 and n$^+$-type source region (or n$^+$-type emitter region) 110, and electrically isolated from the gate electrode 108 by an interlayer dielectric 111. A back surface electrode 113 that forms a drain electrode (or collector electrode) is provided on the back surface of the semiconductor substrate 101.

Next, a description will be given of a method of manufacturing the existing superjunction semiconductor device. FIGS. 19 to 24 are sectional views showing states partway through the manufacture of the existing superjunction semiconductor device. Firstly, as shown in FIG. 19, an n-type doped first level epitaxial layer 120a, which forms the parallel p-n layer 105, is grown on the front surface of the n$^+$-type (or p$^+$-type) semiconductor substrate (semiconductor wafer) 101. Next, an ion implantation 121 of an n-type impurity such as phosphorus (P) is carried out into the whole of the epitaxial layer 120a, thereby forming an n-type impurity region 122 that forms the n-type region 103 of the parallel p-n layer 105.

Next, as shown in FIG. 20, a resist mask 123 in which is opened a portion corresponding to the formation region of the p-type region 104 of the parallel p-n layer 105 is formed on the surface of the epitaxial layer 120a using photolithography and etching. Next, an ion implantation 124 of a p-type impurity such as boron is carried out with the resist mask 123 as a mask, thereby inverting a portion of the n-type impurity region 122 corresponding to the formation region of the p-type region 104 of the parallel p-n layer 105 to a p-type impurity region 125.

Next, as shown in FIG. 21, the resist mask 123 is removed, after which the epitaxial wafer (a substrate formed by epitaxial layers being stacked on the semiconductor substrate 101) is cleaned using a general method (hereafter referred to as wafer cleaning). Next, an n-type doped second level epitaxial layer 120b, which forms the parallel p-n layer 105, is grown on the first level epitaxial layer 120a. Next, the impurities inside the first level epitaxial layer 120a are caused to diffuse by a first thermal processing. By so doing, the n-type region 103 and p-type region 104 of the parallel p-n layer 105 are formed inside the first level epitaxial layer 120a.

Next, as shown in FIG. 22, an n-type impurity region 126 and p-type impurity region 127, which form the n-type region 103 and p-type region 104 of the parallel p-n layer 105, are formed in the same way as the first level epitaxial layer 120a in a surface layer of the second level epitaxial layer 120b. Next, as shown in FIG. 23, an n-type doped third level epitaxial layer 120c, which forms the parallel p-n layer 105, is grown on the second level epitaxial layer 120b after wafer cleaning. Next, the impurities inside the second level epitaxial layer 120b are caused to diffuse by a second thermal processing. By so doing, the n-type region 103 and p-type region 104 of the parallel p-n layer 105 are formed inside the second level epitaxial layer 120b. Also, the n-type region 103 and p-type region 104 inside the second level epitaxial layer 120b join respectively with the n-type region 103 and p-type region 104 inside the lower level epitaxial layer 120a, which are disposed so as to oppose in a vertical direction.

Next, as shown in FIG. 24, an n-type impurity region (not shown) and p-type impurity region (not shown), which form the n-type region 103 and p-type region 104 of the parallel p-n layer 105, are formed in the same way as in the first and second level epitaxial layers 120a and 120b in the third level epitaxial layer 120c. Next, an n-type doped fourth level epitaxial layer 120d, which configures the MOS gate structure, is grown on the third level epitaxial layer 120c after wafer cleaning. Next, the impurities inside the third level epitaxial layer 120c are caused to diffuse by a third thermal processing. By so doing, the n-type region 103 and p-type region 104 of the parallel p-n layer 105 are formed inside the third level epitaxial layer 120c. Also, the n-type region 103 and p-type region 104 inside the third level epitaxial layer 120c join respectively with the n-type region 103 and p-type region 104 inside the lower level epitaxial layer 120b, which are disposed so as to oppose in a vertical direction.

The parallel p-n layer 105 is formed to a predetermined depth in a vertical direction across the three levels of epitaxial layer 120a to 120c by the steps thus far. Next, the unit cell MOS gate structure, front surface electrode 112, and the like, are formed in the fourth level epitaxial layer 120d (on the epitaxial wafer front surface side). At this time, the p-type base region 109 and the p-type region 104 of the parallel p-n layer 105 opposing the p-type base region 109 in a vertical direction are joined by a fourth thermal processing for causing the p-type base region 109 configuring the MOS gate structure to diffuse. Next, the back surface electrode 113 is formed on the back surface of the semiconductor substrate 101 (the back surface of the epitaxial wafer). Subsequently, the trench gate superjunction semiconductor device shown in FIG. 18 is completed by the epitaxial wafer being diced (cut) into chip form.

A superjunction semiconductor device of the medium and high breakdown voltage class is such that the drift resistance reduction effect is considerable, the impurity concentrations of both the n-type region and p-type region configuring the parallel p-n layer are high, and the widths (repetition pitches) thereof are large. Therefore, the increase in the junction field effect transistor (JFET) resistance component is small, and the detrimental effect on the channel resistance component (current capacity) is also small. Meanwhile, a superjunction semiconductor device of the low breakdown voltage class is such that miniaturization of the parallel p-n layer and an increase in concentration are essential, and the drift resistance component is intrinsically low in comparison with the medium and high breakdown voltage class. Therefore, when the drift resistance component is reduced, the ratios of the channel resistance component and JFET resistance component with respect to the on-state resistance increase. Consequently, there is demand for a trench gate superjunction semiconductor device wherein the channel resistance component and JFET resistance component can be reduced. The trench gate superjunction semiconductor device is such that, by the MOS gate (gate dielectric 107 and gate electrode 108) being embedded inside the trench 106, miniaturization is achieved, and the channel resistance component can be reduced. Furthermore, by the depth of the trench 106 being greater than that of the p-type base region 109, the JFET resistance component can be reduced. Therefore, a considerable reduction in on-state resistance can be achieved by adopting a trench gate superjunction semiconductor device.

However, a superjunction semiconductor device of the low breakdown voltage class is such that, even when applying a trench gate structure, the on-state resistance cannot be reduced. The reason for this is as follows. The superjunction semiconductor device is such that the electrical field can be relaxed by the spread of a depletion layer from the p-n junction between the n-type region 103 and p-type region 104 of the parallel p-n layer 105. Therefore, the drift resistance can be reduced by increasing the impurity concentration of the n-type region 103, but the impurity concentration of the p-type region 104 is also increased in order to achieve approximate charge balance in the parallel p-n layer 105. Also, as heretofore described, the p-type base region 109 and the p-type region 104 of the parallel p-n layer 105 are brought into contact in order to prevent a decrease in breakdown voltage. Therefore, the high impurity concentration p-type region 104 of the parallel p-n layer 105 diffuses in a horizontal direction at a junction with the p-type base region 109, and protrudes onto the n-type region 103 side (a portion indicated by reference sign 114), when carrying out thermal processing for causing the p-type base region 109 (p-type well region) to diffuse, or owing to subsequent thermal history. Therefore, the width of the n-type region 103 of the parallel p-n layer 105 decreases in the vicinity of the junction with the p-type base region 109, and the path of current flowing from a channel (an inversion layer formed in the p-type base region 109 when in an on-state) toward the back surface electrode 113 narrows. Therefore, there is an increase in on-state resistance (JFET resistance component) due to the JFET effect, which barely exists in an existing trench gate semiconductor device.

To date, a method whereby the epitaxial growth temperature and hydrogen annealing temperature are reduced (for example, refer to JP-A-2011-192824 (Paragraph 0029)), a method whereby thermal history applied to the substrate after the formation of the p-type well region is reduced, and the like, have been proposed as methods of restricting the horizontal diffusion of the p-type region of the parallel p-n layer. A method whereby a planar gate superjunction semiconductor device is fabricated for the medium and high breakdown voltage class being disclosed in JP-A-2011-192824, an epitaxial layer that forms a parallel p-n layer is grown without doping, and the temperatures of previous processing, epitaxial growth, and hydrogen annealing are reduced, in order to prevent outward diffusion of impurities that causes breakdown decrease and defects due to the charge balance in the parallel p-n layer breaking down.

Also, a method whereby, when fabricating a trench gate MOSFET wherein a superjunction structure is formed using multilevel epitaxial growth, a drift layer is formed to a predetermined depth by repeating a step of epitaxially growing an n⁻-type high resistance layer on a low resistance n-type substrate and a step of forming a photoresist mask pattern and selectively ion implanting boron (B) into the n⁻-type high resistance layer, and furthermore, forming a photoresist mask pattern and selectively ion implanting phosphorus (P) into the n⁻-type high resistance layer, after which a parallel p-n layer is formed by causing the impurities to diffuse by thermal processing, has been proposed as another method of manufacturing a superjunction semiconductor device (for example, refer to JP-A-2000-40822 (Paragraphs 0032 to 0035, FIGS. 4 and 14)).

Also, the following method has been proposed as another method of manufacturing a superjunction semiconductor device. A low concentration n⁻-type epitaxial layer that forms a buffer is formed on a high concentration n⁺-type silicon (Si) substrate of a thickness of 625 μm, an undoped epitaxial layer is formed on the n⁻-type epitaxial layer, and an overall ion implantation of phosphorus is carried out, after which an ion implantation of boron is selectively carried out. The formation of the undoped epitaxial layer and the ion implantations of phosphorus and boron are carried out repeatedly, after which the impurities in the epitaxial layer are caused to diffuse by thermal processing, thereby forming a parallel p-n layer. Further, after a MOS gate structure is formed on the parallel p-n layer, the back surface side of the n$^+$-type silicon substrate is ground (backgrinding), and an electrode is formed on the substrate back surface after grinding (for example, refer to JP-A-2011-243865 (Paragraphs 0016 and 0021, FIG. 1)).

Also, a method whereby, when fabricating an IGBT incorporating a freewheeling diode (FWD) on a single substrate, an n$^-$-type drift layer is epitaxially grown on an n-type silicon substrate, a MOS gate structure is formed on the n$^-$-type drift layer, and the n-type silicon substrate is ground to a predetermined thickness by grinding from the back surface side, after which an ion implantation is selectively carried out from the back surface of the n-type silicon substrate after grinding, thereby forming a p$^+$-type region in a portion corresponding to the formation region of the IGBT, and forming an n$^+$-type region aligned in a horizontal direction with the p$^+$-type region of the IGBT in a portion corresponding to the formation region of the FWD, has been proposed as a method of forming a p-type region and n-type region so as to be aligned in a horizontal direction (for example, refer to JP-A-2008-283112 (Paragraphs 0032 to 0037)).

SUMMARY OF THE INVENTION

However, the heretofore described method whereby the epitaxial growth temperature and hydrogen annealing temperature are reduced, and the method whereby the thermal history applied to the semiconductor device after the formation of the p-type well region is reduced, are such that there is a limit to the advantage of limiting the thermal history when fabricating the semiconductor device. That is, even when there is a reduction in the channel resistance component owing to miniaturization of the parallel p-n layer and application of a trench gate structure, accompanying a reduction in the breakdown voltage of the superjunction semiconductor device, applying a trench gate structure involves an increase in the JFET resistance component due to diffusion in a horizontal direction of the p-type region of the parallel p-n layer caused by thermal history, and there is concern that the on-state resistance cannot be reduced. This kind of problem, not being limited to the heretofore described n-channel type, also occurs in the case of a p-channel type wherein the n-type and p-type are inverted.

The invention, in order to resolve the problem of the heretofore described existing technology, has an object of providing a semiconductor device manufacturing method such that miniaturization of a parallel p-n layer can be achieved, and the on-state resistance can be reduced.

In order to resolve the heretofore described problem, thus achieving the object of the invention, a semiconductor device manufacturing method according to an aspect of the invention is a method of manufacturing a semiconductor device including a parallel p-n layer wherein a first conductivity type semiconductor region and second conductivity type semiconductor region are repeatedly alternately disposed, and has the following characteristics. Firstly, a first formation step wherein a first deposition step of depositing a first conductivity type first semiconductor layer and a first introduction step of selectively introducing a first conductivity type impurity and second conductivity type impurity into the first semiconductor layer, thereby repeatedly alternately disposing a first first conductivity type impurity region and second conductivity type impurity region in a surface layer of the first semiconductor layer, are repeatedly carried out; and. Next, a thermal processing step of forming the parallel p-n layer by causing the first first conductivity type impurity region and second conductivity type impurity region to diffuse using thermal processing. Further, a second introduction step of selectively introducing a first conductivity type impurity into a portion of the uppermost of the first semiconductor layers sandwiched between neighboring second conductivity type impurity regions, thereby increasing the first conductivity type impurity concentration in a portion of the uppermost of the first semiconductor layers on the second conductivity type impurity region side, is further carried out in the first formation step.

Also, the semiconductor device manufacturing method according to the aspect of the invention is characterized in that a second first conductivity type impurity region of an impurity concentration higher than that of the first semiconductor layer, and having a first conductivity type impurity concentration that can restrict diffusion of the second conductivity type impurity region to the first first conductivity type impurity region side due to the thermal processing, is formed in the second introduction step in a portion of the uppermost of the first semiconductor layers sandwiched between neighboring second conductivity type impurity regions.

Also, the semiconductor device manufacturing method according to the aspect of the invention is characterized in that the first first conductivity type impurity region and second conductivity type impurity region are disposed separated in at least the first introduction step carried out on the uppermost of the first semiconductor layers.

Also, the semiconductor device manufacturing method according to the aspect of the invention is characterized in that when the second conductivity type impurity is selectively introduced by ion implantation into the first semiconductor layer, thereby forming the second conductivity type impurity region in the uppermost of the first semiconductor layers, in the first introduction step, the dose and acceleration energy of the ion implantation are set so that the depth of the second conductivity type impurity region is one-tenth or more, one-half or less, of the depth of the first semiconductor layer.

Also, the semiconductor device manufacturing method according to the aspect of the invention is characterized in that the impurity concentration of the first semiconductor layer is $5\times10^{15}/cm^3$ or more, $1\times10^{17}/cm^3$ or less.

Also, the semiconductor device manufacturing method according to the aspect of the invention is characterized in that the first semiconductor layer is deposited in the first deposition step on a first conductivity type third semiconductor layer of an impurity concentration higher than that of the first conductivity type semiconductor region, and having an impurity concentration of $5\times10^{15}/cm^3$ or more, $1\times10^{17}/cm^3$ or less, and a thinning step of grinding the third semiconductor layer from the side opposite to the first semiconductor layer side, and a third formation step of introducing an impurity into the third semiconductor layer from the ground surface side of the third semiconductor layer, thereby forming a first conductivity type or second conductivity type fourth semiconductor layer of an impurity concentration higher than that of the third semiconductor layer, are carried out after the thermal processing step.

Also, the semiconductor device manufacturing method according to the aspect of the invention is characterized in that the impurity concentration of the fourth semiconductor layer is $1\times10^{15}/cm^3$ or more, $1\times10^{18}/cm^3$ or less.

Also, the semiconductor device manufacturing method according to the aspect of the invention is characterized in that the first semiconductor layer is deposited in the first deposition step on a first conductivity type fourth semiconductor layer of an impurity concentration higher than that of the first conductivity type semiconductor region, and having an impurity concentration of $1 \times 10^{15}/cm^3$ or more, $1 \times 10^{18}/cm^3$ or less, and a thinning step of grinding the fourth semiconductor layer from the side opposite to the first semiconductor layer side is carried out after the thermal processing step.

Also, the semiconductor device manufacturing method according to the aspect of the invention is characterized in that a second deposition step of depositing a first conductivity type second semiconductor layer on the surface of the first semiconductor layer, and an element structure formation step of forming an insulated gate structure formed of metal-oxide-semiconductor in the second semiconductor layer, wherein the thermal processing step is carried out simultaneously with, of the steps included in the element structure formation step, a diffusion step of causing a semiconductor region in which a channel is formed to diffuse.

Also, the semiconductor device manufacturing method according to the aspect of the invention is characterized in that a third deposition step of depositing a fifth semiconductor layer and a third introduction step of selectively introducing the first conductivity type impurity and second conductivity type impurity into the fifth semiconductor layer, thereby repeatedly alternately disposing the first first conductivity type impurity region and second conductivity type impurity region in a surface layer of the fifth semiconductor layer, are repeatedly carried out before the first deposition step in the first formation step. Further, repetition of the first deposition step and first introduction step is carried out at least once after the third introduction step, thereby forming the first semiconductor layer on the uppermost level.

According to the invention, it is possible to restrict diffusion in a horizontal direction of the second conductivity type impurity region formed in the uppermost first conductivity type first semiconductor layer forming the parallel p-n layer. Therefore, it is possible to restrict protrusion of the second conductivity type semiconductor region of the parallel p-n layer onto the parallel p-n layer first conductivity type semiconductor region side at a junction with the element structure (a junction of the first semiconductor layer and second semiconductor layer). Therefore, it is possible to prevent a decrease in the width of the first conductivity type semiconductor region of the parallel p-n layer.

According to the semiconductor device manufacturing method according to the invention, there are advantages in that miniaturization of a parallel p-n layer can be achieved, and the on-state resistance can be reduced.

BRIEF DESCRIPTION OF THE DRAWINGS

FIG. 8 is a table showing the impurity concentrations and thicknesses of a parallel p-n layer of a superjunction semiconductor device according to the first embodiment;

DETAILED DESCRIPTION OF THE INVENTION

Hereafter, referring to the attached drawings, a detailed description will be given of preferred embodiments of the semiconductor device manufacturing method according to the invention. In the specification and attached drawings, a layer or region being prefixed by n or p means that electrons or holes respectively are majority carriers. Also, + or − being attached to n or p indicates a higher impurity concentration or lower impurity concentration respectively than in a layer or region to which n or p is not attached. In the following description of the embodiments and the attached drawings, the same reference signs are given to identical configurations, and redundant descriptions are omitted.

First Embodiment

Figure 1:
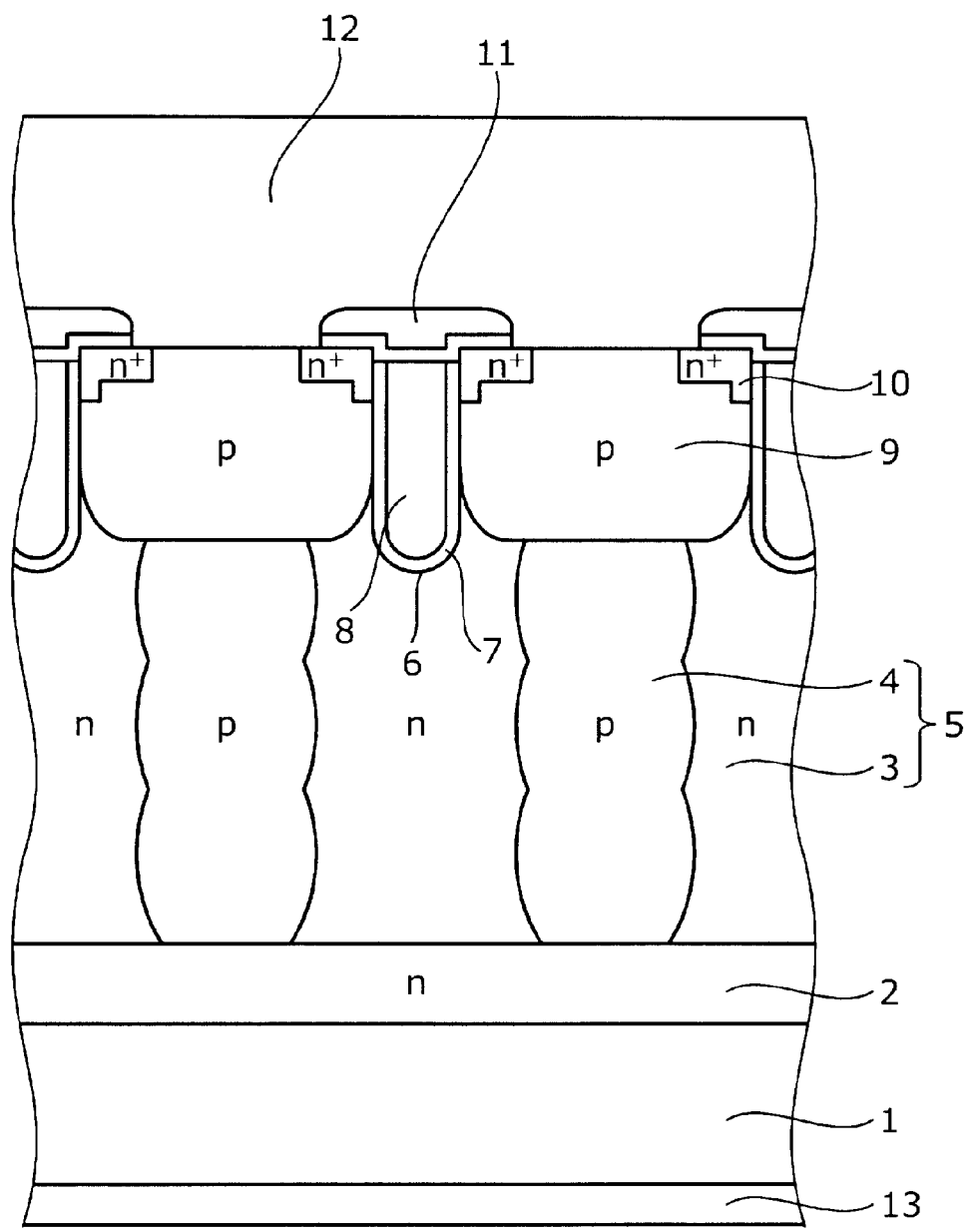
FIG. 1 is a sectional view showing one example of the structure of a semiconductor device according to a first embodiment.

Firstly, a description will be given of the structure of a trench gate superjunction semiconductor device as one example of a semiconductor device fabricated (manufactured) using the semiconductor device manufacturing method according to a first embodiment. FIG. 1 is a sectional view showing one example of the structure of a semiconductor device according to the first embodiment. The semiconductor device according to the first embodiment shown in FIG. 1 is a superjunction semiconductor device having as a drift layer a parallel p-n layer 5 wherein an n-type region (first-conductivity-type semiconductor region) 3, in which the impurity concentration is increased, and a p-type region (second-conductivity-type semiconductor region) 4 are repeatedly alternately disposed in a direction (horizontal direction) parallel to a substrate main surface. An n-type buffer layer (third semiconductor layer) 2 is provided between an n$^+$-type (or p$^+$-type) semiconductor substrate (fourth semiconductor layer) 1 and the parallel p-n layer 5. The n$^+$-type semiconductor substrate 1 forms, for example, an n$^+$-type drain layer, on which, for example, a MOSFET is configured as the superjunction semiconductor device of FIG. 1. The p$^+$-type semiconductor substrate 1 forms, for example, a p$^+$-type collector layer, on which, for example, an IGBT is configured as the superjunction semiconductor device of FIG. 1.

Multiple levels of epitaxial layer are stacked on the front surface of the semiconductor substrate 1, and an epitaxial substrate (semiconductor chip) is configured of the semiconductor substrate 1 and multiple levels of epitaxial layer. Of the multiple levels of epitaxial layer stacked on the front surface of the semiconductor substrate 1, the lowermost epitaxial layer (the epitaxial layer in contact with the semiconductor substrate 1) is the n-type buffer layer 2. It is preferable when the impurity concentration of the semiconductor substrate 1 is higher than the impurity concentration of the n-type buffer layer 2, and in the region of, for example, between $1 \times 10^{15}$/cm$^3$ or more, and $1 \times 10^{18}$/cm$^3$ or less. It is preferable when the impurity concentration of the n-type buffer layer 2 is equal to or higher than the impurity concentration of the n-type region 3 of the parallel p-n layer 5, and in the region of, for example, between $5 \times 10^{15}$/cm$^3$ or more, and $1 \times 10^{17}$/cm$^3$ or less. The reason for this is as follows. When the impurity concentration of the n-type buffer layer 2 is less than $5 \times 10^{15}$/cm$^3$, the on-state resistance is 0.9 mΩ·sq or greater, which lacks in practicality. Also, when the impurity concentration of the n-type buffer layer 2 is higher than $1 \times 10^{17}$/cm$^3$, the concentration difference at the junction with the p-type region 4 is large, the depletion layer does not extend, and breakdown voltage decreases.

The parallel p-n layer 5 is configured of the multiple levels of epitaxial layer (first semiconductor layers) stacked on the n-type buffer layer 2. Specifically, the parallel p-n layer 5 is formed by the n-type region 3 and p-type region 4 being repeatedly alternately disposed in a horizontal direction. The n-type region 3 of the parallel p-n layer 5 is provided inside the multiple levels of epitaxial layer, across the multiple levels of epitaxial layer in the substrate depth direction (vertical direction), in contact with the n-type buffer layer 2. The p-type region 4 of the parallel p-n layer 5 is provided inside the multiple levels of epitaxial layer, across the multiple levels of epitaxial layer in the substrate depth direction (vertical direction), in contact with the n-type buffer layer 2. It is good when the number of stacked epitaxial layers configuring the parallel p-n layer 5 is, for example, six or less. The reason for this is as follows. When the number of levels is increased, a commensurate variation in impurity concentration and thickness occurs every time an epitaxial layer is added, and furthermore, displacement or the like occurs when positioning, because of which process variation increases. Therefore, process variation is restricted to 20% or less by the number of levels being restricted to six or less. Also, forming each level of epitaxial layer thickly using high acceleration implantation, or the like, thereby reducing the number of levels, is effective in restricting process variation.

The width of the p-type region 4 of the parallel p-n layer 5 (the width in the direction in which the n-type region 3 and p-type region 4 of the parallel p-n layer 5 are aligned, hereafter referred to simply as the width) is less than the width of a p-type base region 9 (that is, the distance between neighboring trenches 6 (mesa width)), to be described hereafter. The horizontal direction impurity concentration distribution of the p-type region 4 of the parallel p-n layer 5 is highest in a central portion of the p-type region 4, and decreases from the central portion of the p-type region 4 toward the n-type region 3 side. A unit cell (functional unit of an element) including a general trench gate MOS gate structure is provided on the parallel p-n layer 5 (the front surface side of the epitaxial substrate). That is, the MOS gate structure is provided in the uppermost epitaxial layer of the multiple levels of epitaxial layer stacked on the semiconductor substrate 1.

The MOS gate structure is formed of the trench 6, a gate dielectric 7, a gate electrode 8, the p-type base region 9, and an n$^+$-type source region (or n$^+$-type emitter region) 10. The p-type base region 9 is disposed so as to oppose the p-type region 4 of the parallel p-n layer 5 in a vertical direction, and in contact with the p-type region 4, in order to prevent a decrease in breakdown voltage. A front surface electrode 12 that forms a source electrode (or emitter electrode) is in contact with the p-type base region 9 and n$^+$-type source region (or n$^+$-type emitter region) 10, and electrically isolated from the gate electrode 8 by an interlayer dielectric 11. A back surface electrode 13 that forms a drain electrode (or collector electrode) is provided on the back surface of the semiconductor substrate 1. Although one unit cell is shown in FIG. 1, multiple unit cells may be disposed in an active region through which current flows (which is responsible for current drive) when in an on-state.

Figure 2:
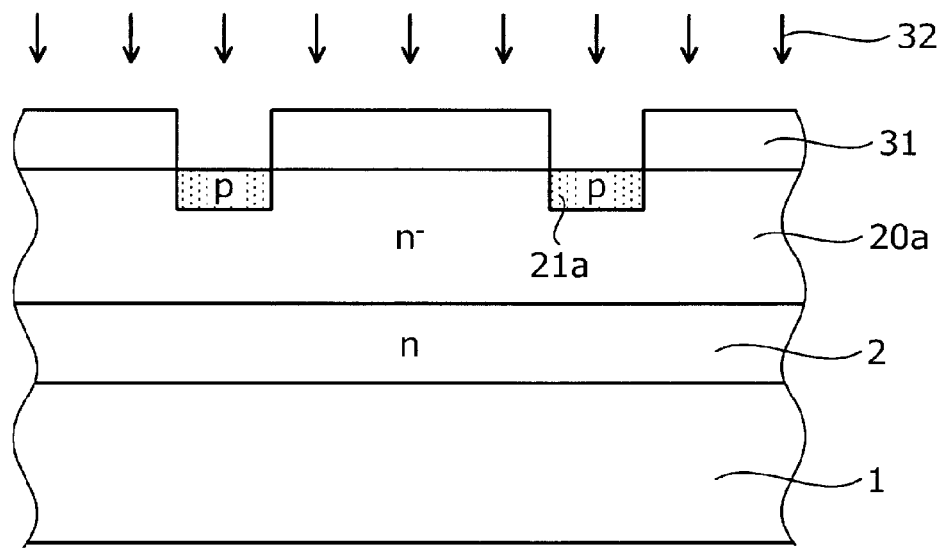
FIG. 2 is a sectional view showing a state partway through the manufacture of the semiconductor device according to the first embodiment.

Next, a description will be given of a method of manufacturing the semiconductor device according to the first embodiment, with a case of forming the parallel p-n layer 5 from three levels of epitaxial layer as an example. FIGS. 2 to 6B are sectional views showing states partway through the manufacture of the semiconductor device according to the first embodiment. FIGS. 7A to 7C are plan views showing another example of states partway through the manufacture of the semiconductor device according to the first embodiment. Firstly, as shown in FIG. 2, the n$^+$-type (or p$^+$-type) semiconductor substrate (semiconductor wafer) 1 is prepared as a starting substrate (starting wafer). Next, an n-type epitaxial layer that forms the n-type buffer layer 2 is grown (formed (deposited)) on the front surface of the semiconductor substrate 1. An epitaxial substrate such that an n-type epitaxial layer that forms the n-type buffer layer 2 is deposited (formed) in advance on the semiconductor substrate 1 may also be prepared as a starting substrate.

Next, an n⁻-type doped first level epitaxial layer (first semiconductor layer, first layer) 20a, which forms the parallel p-n layer 5, is grown on the n-type buffer layer 2. Next, a resist mask 31 in which is opened a portion corresponding to the formation region of the p-type region 4 of the parallel p-n layer 5 is formed on the surface of the first level epitaxial layer 20a using photolithography and etching. Next, an ion implantation 32 of a p-type impurity such as boron (B) is carried out with the resist mask 31 as a mask, thereby selectively forming a p-type impurity region (second-conductivity-type impurity region, second impurity region) 21a, which forms the p-type region 4 of the parallel p-n layer 5, in a surface layer of the first level epitaxial layer 20a. Then, the resist mask 31 is removed.

Figure 3:
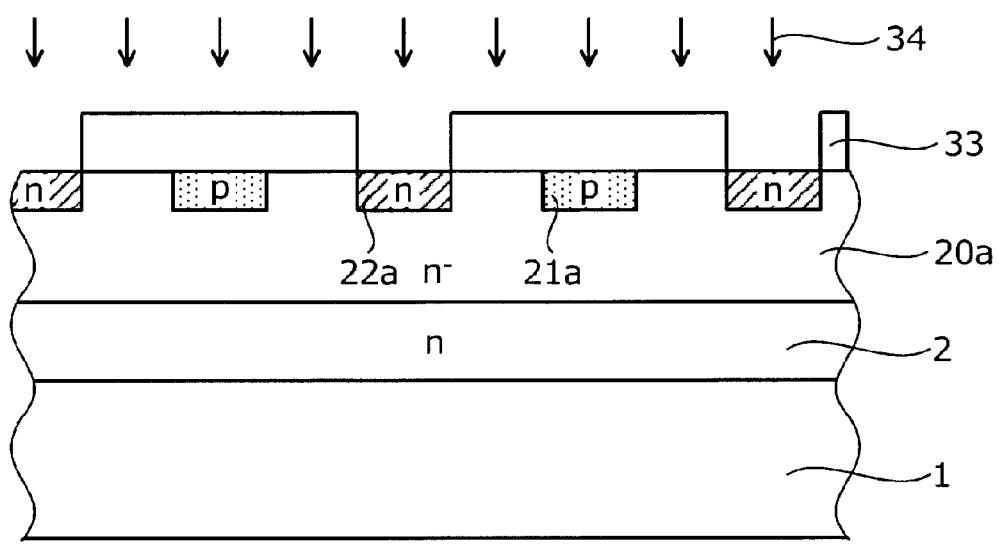
FIG. 3 is a sectional view showing a state partway through the manufacture of the semiconductor device according to the first embodiment.

Next, as shown in FIG. 3, a resist mask 33 in which is opened a portion corresponding to the formation region of the n-type region 3 of the parallel p-n layer 5 is formed on the surface of the first level epitaxial layer 20a using photolithography and etching. Next, an ion implantation 34 of an n-type impurity such as phosphorus (P) is carried out with the resist mask 33 as a mask, thereby selectively forming an n-type impurity region (first first-conductivity-type impurity region, first impurity region) 22a, which forms the n-type region 3 of the parallel p-n layer 5, in a surface region of the first level epitaxial layer 20a. The order of the ion implantations 32 and 34 for forming the p-type impurity region 21a and n-type impurity region 22a may be reversed. Then, the resist mask 33 is removed.

The width of the aperture portion of the resist mask 31 used in the ion implantation 32 for forming the p-type impurity region 21a is less than the width of the p-type region 4 of the parallel p-n layer 5. That is, after the ion implantations 32 and 34, the n-type impurity region 22a and p-type impurity region 21a are formed repeatedly and alternately, and distanced from each other, in a surface layer of the first level epitaxial layer 20a. Therefore, even when the extent of horizontal diffusion of the p-type impurity region 21a (the distance for which the p-type impurity region 21a spreads in a horizontal direction) is the same as that heretofore known, the amount by which the p-type region 4 protrudes onto the n-type region 103 side can be reduced. Therefore, it is possible to prevent the width of the n-type region 3 from decreasing, or the n-type region 3 from disappearing, due to thermal diffusion.

In the same way, the width of the aperture portion of resist masks used in ion implantations for forming p-type impurity regions that form the p-type region 4 of the parallel p-n layer 5 in other (second and third level) epitaxial layers forming the parallel p-n layer 5, deposited in steps to be described hereafter, is less than the width of the p-type region 4 of the parallel p-n layer 5. The reason for this is the same as that for the resist mask 31 used in the ion implantation 32 for forming the p-type impurity region 21a in the first level epitaxial layer 20a. Also, the configuration may be such that the width of the aperture portion of only the resist mask used in the ion implantation for forming the p-type impurity region that forms the p-type region 4 of the parallel p-n layer 5 in the uppermost (third level) epitaxial layer of the multiple levels of epitaxial layer forming the parallel p-n layer 5 is less than the width of the p-type region 4 of the parallel p-n layer 5.

Figure 4:
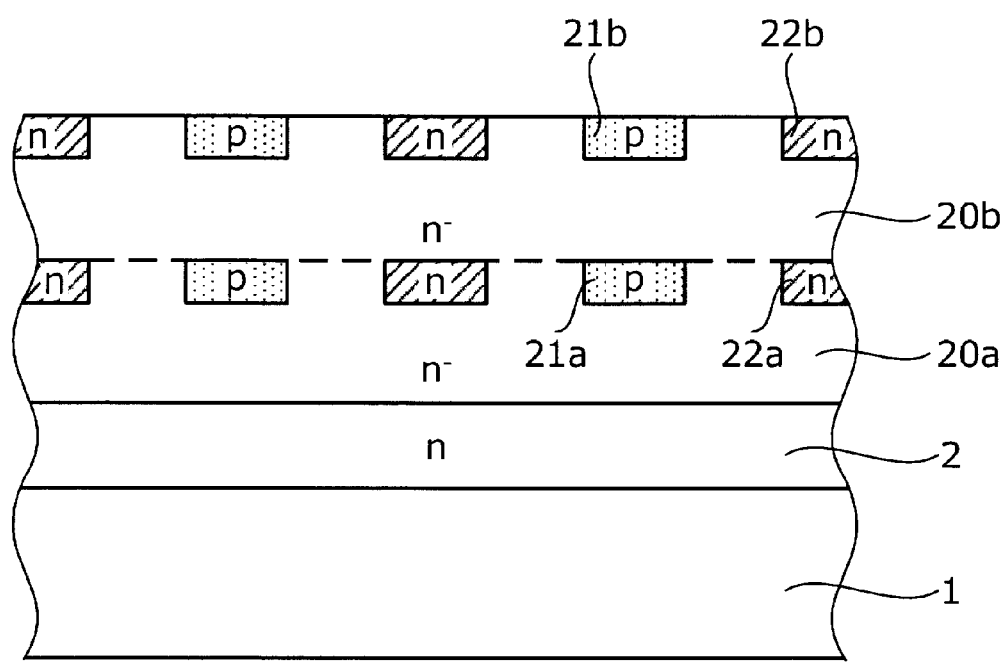
FIG. 4 is a sectional view showing a state partway through the manufacture of the semiconductor device according to the first embodiment.

Next, after the epitaxial wafer is cleaned using a general method (hereafter referred to as wafer cleaning), an n⁻-type doped second level epitaxial layer 20b, which forms the parallel p-n layer 5, is grown on the first level epitaxial layer 20a, as shown in FIG. 4. Next, in the same way as on the first level epitaxial layer 20a, an n-type impurity region (first first-conductivity-type impurity region) 22b and p-type impurity region (second-conductivity-type impurity region) 21b, which form the n-type region 3 and p-type region 4 of the parallel p-n layer 5, are each selectively formed in a surface layer of the second level epitaxial layer (first semiconductor layer) 20b. At this time, the n-type impurity region 22b and p-type impurity region 21b are disposed so as to oppose the n-type impurity region 22a and p-type impurity region 21a respectively of the first level epitaxial layer 20a in a vertical direction.

Figure 5A:
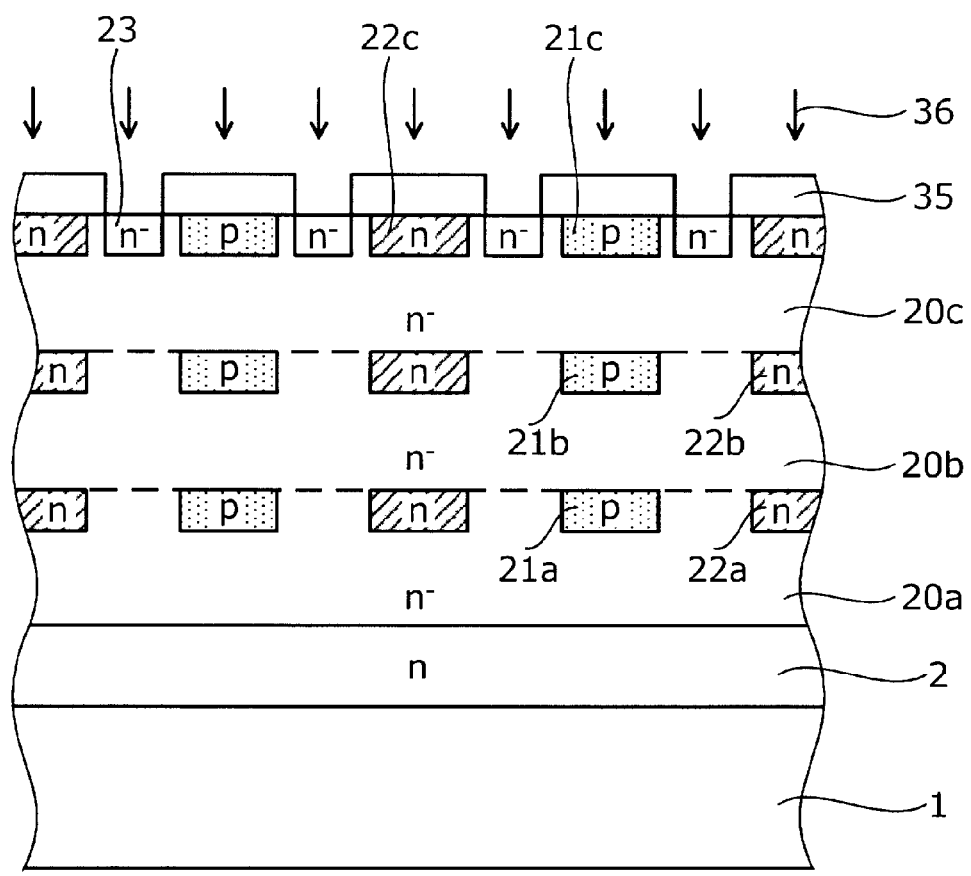
FIG. 5A and FIG. 5B are sectional views showing a state partway through the manufacture of the semiconductor device according to the first embodiment.

Next, after wafer cleaning, an n⁻-type doped third level epitaxial layer (first semiconductor layer, second layer) 20c, which forms the parallel p-n layer 5, is grown on the second level epitaxial layer 20b, as shown in FIG. 5A. The third level epitaxial layer 20c is the uppermost layer of the multiple epitaxial layers forming the parallel p-n layer 5. That is, the total thickness of the three levels of epitaxial layer 20a to 20c is the predetermined thickness of the parallel p-n layer 5. Next, in the same way as on the second level epitaxial layer 20b, an n-type impurity region (first first-conductivity-type impurity region) 22c and p-type impurity region (second-conductivity-type impurity region) 21c, which form the n-type region 3 and p-type region 4 of the parallel p-n layer 5, are each selectively formed in a surface layer of the third level epitaxial layer 20c so as to oppose the lower layer n-type impurity region 22b and p-type impurity region 21b in a vertical direction.

At this time, it is good when the depth from the surface of the epitaxial layer 20c of the p-type impurity region 21c formed in the third level epitaxial layer 20c is one-tenth or more, one-half or less, of the thickness of the epitaxial layer 20c. Therefore, it is possible to prevent the width of the p-type region 4 from increasing because of the p-type region 4 and p-type base region 9 joining and diffusing too far due to subsequent thermal history. Also, when the breakdown voltage class is a low class of 200V or less, it is desirable that the depth from the surface of the epitaxial layer 20c of the p-type impurity region 21c is one-fifth or more, one-third or less, of the thickness of the epitaxial layer 20c. The reason for this is that horizontal direction diffusion of the p-type impurity region that forms the p-type region 4 of the parallel p-n layer 5 can be further restricted. In order for the depth from the surface of the epitaxial layer 20c of the p-type impurity region 21c to fall within the heretofore described range, it is sufficient, for example, to variously adjust the dose and acceleration energy of the ion implantation for forming the p-type impurity region 21c in the third level epitaxial layer 20c. Specifically, the dose and acceleration energy of the ion implantation for forming the p-type impurity region 21c in the third level epitaxial layer 20c may be, for example, $2 \times 10^{13}/cm^2$ and 100 keV respectively.

Next, a resist mask 35 in which is exposed an arbitrary place on the periphery of the p-type impurity region 21c (for example, a place between the n-type impurity region 22c and p-type impurity region 21c but nearer to the p-type impurity region 21c) is formed by photolithography and etching on the surface of the third level epitaxial layer 20c. Next, an ion implantation 36 of an n-type impurity such as phosphorus is carried out with the resist mask 35 as a mask, thereby selectively forming an n⁻-type impurity region (hereafter referred to as an n⁻-type counter region (second firstconductivity-type impurity region)) 23 in a surface layer of the third level epitaxial layer 20c. The impurity concentration of the n⁻-type counter region 23 is slightly higher than the impurity concentration of the third level epitaxial layer 20c, and lower than the impurity concentration of the n-type impurity region 22c. Specifically, the impurity concentration and thickness of the n⁻-type counter region 23 may be, for example, $2.00 \times 10^{16}$/cm³ and 1.0 µm respectively.

As it is sufficient that the n⁻-type counter region 23 is disposed in a portion sandwiched between neighboring p-type impurity regions 21c, the n⁻-type counter region 23 may be in contact with the n-type impurity region 22c or p-type impurity region 21c, or may be disposed distanced from the n-type impurity region 22c and p-type impurity region 21c. Also, the resist mask 35 in which is opened a portion corresponding to the formation region of the n⁻-type counter region 23 is shown in FIG. 5A, but the n-type impurity region 22c may equally well be exposed in the aperture portion of the resist mask 35. The order of the ion implantations for forming the n-type impurity region 22c, p-type impurity region 21c, and n⁻-type counter region 23 can be variously changed.

For example, FIGS. 7A to 7C show one example of a planar disposition of the n⁻-type counter region 23, when the parallel p-n layer 5 is disposed in a stripe form planar layout extending in a second direction (an up-down direction in FIGS. 7A to 7C) perpendicular to a first direction (a left-right direction in FIGS. 7A to 7C) in which the n-type region 3 and p-type region 4 of the parallel p-n layer 5 are aligned. The n-type impurity region 22c formed in the third level epitaxial layer 20c is omitted from FIGS. 7A to 7C. The n⁻-type counter region 23 may be disposed over the whole of a portion sandwiched between neighboring p-type impurity regions 21c of the third level epitaxial layer 20c, so as to be in contact with the p-type impurity regions 21c (FIG. 7A). Also, the n⁻-type counter region 23 may be disposed distanced from the p-type impurity regions 21c in a central portion of a portion sandwiched between neighboring p-type impurity regions 21c, and in a linear planar layout extending in the second direction (FIG. 7B). Also, the n⁻-type counter region 23 may be disposed in contact with the p-type impurity regions 21c in a portion sandwiched between neighboring p-type impurity regions 21c, and in a linear planar layout following a side plane of the p-type impurity region 21c parallel to the second direction (FIG. 7C).

Figure 6A:
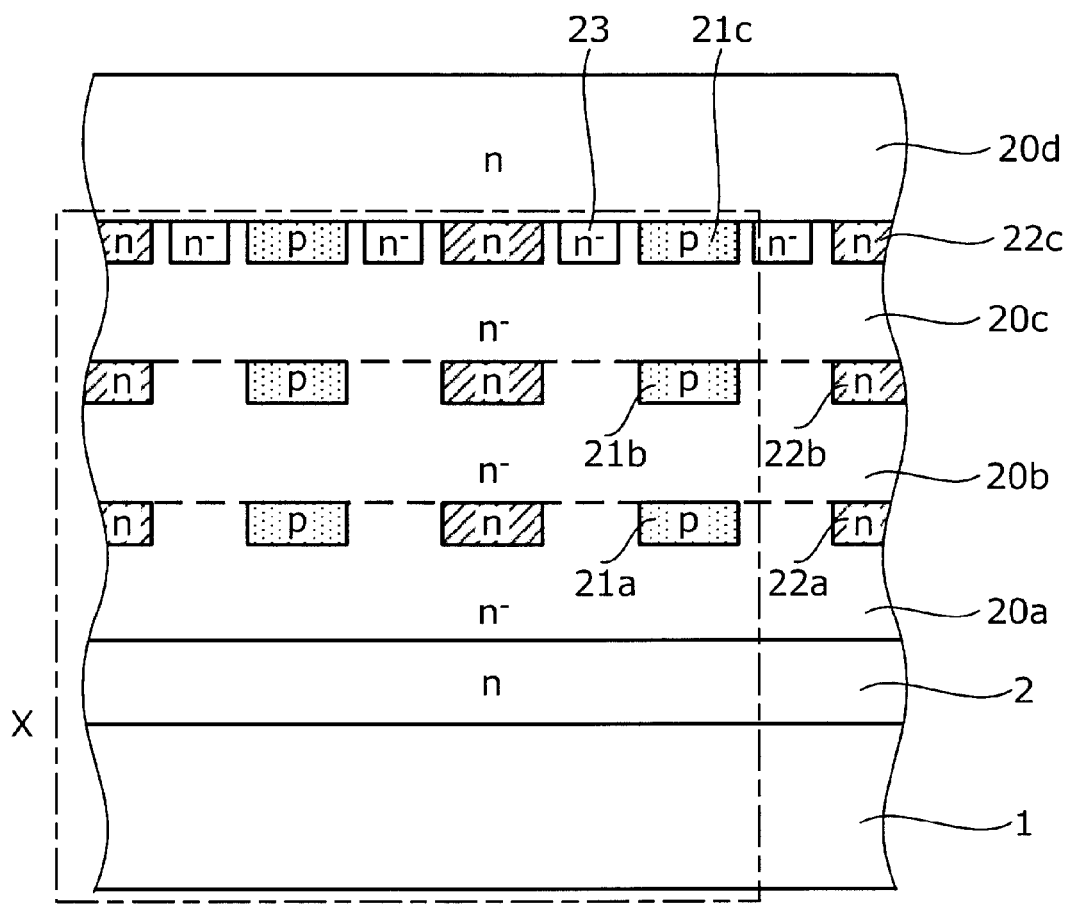
FIGS. 6A and 6B are a sectional view and an enlarged view showing a state partway through the manufacture of the semiconductor device according to the first embodiment.
Figure 7A:
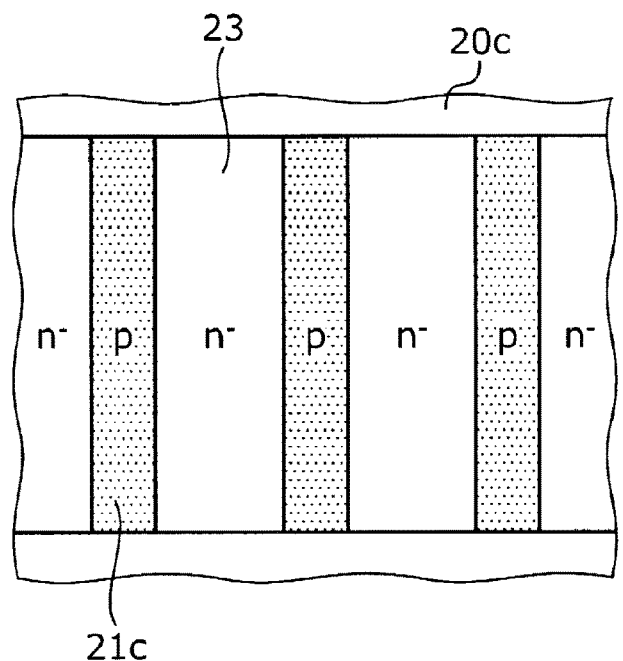
FIGS. 7A to 7C are plan views showing another example of states partway through the manufacture of the semiconductor device according to the first embodiment.
Figure 7B:
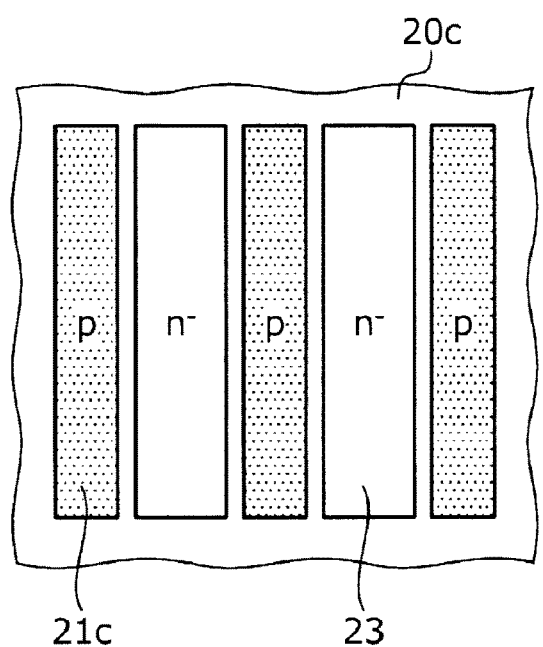
Figure 7C:
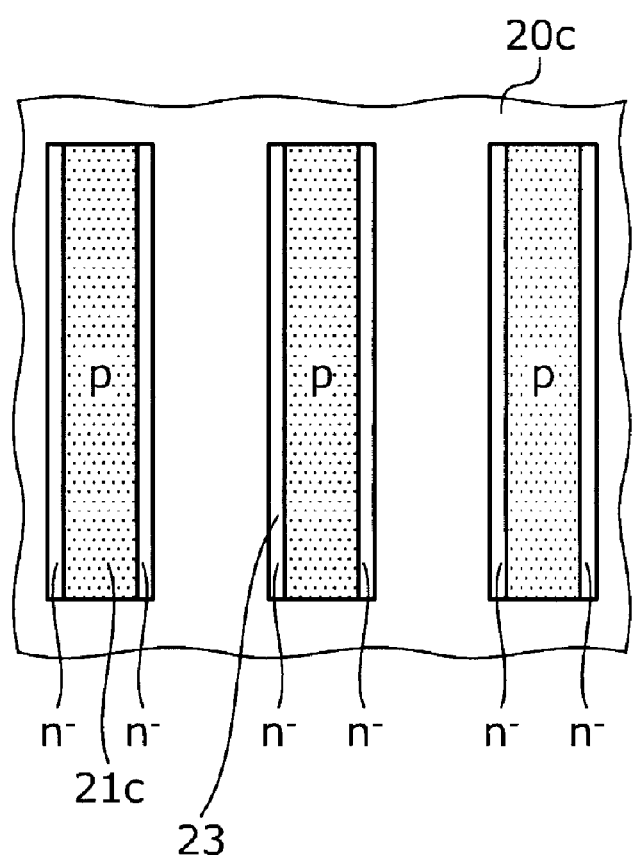

Next, after wafer cleaning, an n-type doped fourth level epitaxial layer 20d (second semiconductor layer, third semiconductor layer), in which the MOS type transistors are formed, is grown on the third level epitaxial layer 20c, as shown in FIG. 6A. Therefore, the total thickness of the semiconductor substrate 1, n-type buffer layer 2, and four levels of epitaxial layer 20a to 20d (the epitaxial wafer thickness) is the amount of the chip thickness accounted for by epitaxial thickness when the product is completed. Next, the unit cell MOS gate structure, front surface electrode 12, and the like, are formed in the fourth level epitaxial layer 20d (on the epitaxial wafer front surface side). At this time, the n-type impurity regions 22a to 22c and p-type impurity regions 21a to 21c inside the first level to third level epitaxial layers 20a to 20c are caused to diffuse by a thermal processing for causing the p-type base region 9 configuring the MOS gate structure to diffuse (hereafter referred to as a diffusion process).

Figure 6B:
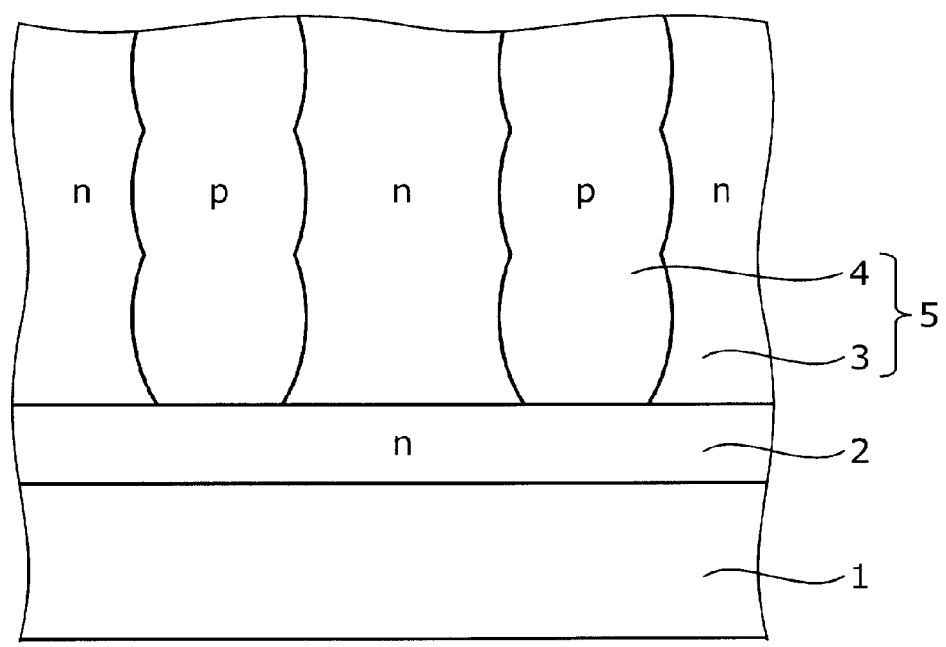

FIG. 6B shows an enlarged view of an X portion shown in FIG. 6A after the diffusion process. In the diffusion process, the n-type impurity regions 22a to 22c opposed in a vertical direction join together, and the p-type impurity regions 21a to 21c opposed in a vertical direction join together. Therefore, the n-type region 3, formed by the n-type impurity regions 22a to 22c joining together, and the p-type region 4, formed by the p-type impurity regions 21a to 21c joining together, are formed across the first level to third level epitaxial layers 20a to 20c. The n-type impurity region 22a and p-type impurity region 21a inside the first level epitaxial layer 20a penetrate the first level epitaxial layer 20a in a vertical direction, reaching the n-type buffer layer 2. That is, the parallel p-n layer 5 is formed to a depth equivalent to the total thickness of the three levels of epitaxial layer 20a to 20c in a vertical direction across the three levels of epitaxial layer 20a to 20c. By causing the p-type base region 9 and parallel p-n layer 5 to diffuse at one time in this way, the thermal load exerted on the epitaxial layers 20a to 20c can be restricted, because of which diffusion in a horizontal direction of the n-type impurity regions 22a to 22c and p-type impurity regions 21a to 21c forming the parallel p-n layer 5 is restricted.

Also, the p-type base region 9 and the p-type region 4 of the parallel p-n layer 5 opposing the p-type base region 9 in a vertical direction are joined together in the diffusion process in order to prevent a decrease in breakdown voltage. The p-type impurity regions 21a to 21c can be prevented from protruding onto the n-type impurity region 22a to 22c sides at this time, or due to subsequent thermal history. The reason for this is as follows. The impurity concentration of the portion of the third level epitaxial layer 20c in which the n⁻-type counter region 23 is formed is slightly higher than the impurity concentration of the third level epitaxial layer 20c. Therefore, the p-type impurity concentration in a portion in which the p-type impurity regions 21a to 21c extend in a horizontal direction is canceled out by the n⁻-type counter region 23 and decreases, and diffusion in a horizontal direction of the p-type impurity region 21c is restricted. Therefore, protrusion of the p-type impurity region 21c onto the n-type impurity region 22c side at the junction with the p-type base region 9 is restricted. Also, the epitaxial layers 20a to 20c being n⁻-type doped also has the advantage of restricting diffusion in a horizontal direction of the p-type impurity regions 21a to 21c.

The depth of the p-type base region 9 may be in the region of, for example, 1.2 µm or more, 1.4 µm or less. The impurity concentration of the p-type base region 9 may be in the region of, for example, $2 \times 10^{17}$/cm³. The depth of the trench 6 may be in the region of, for example, 1.6 µm. The width of the trench 6 may be in the region of 0.6 µm or more, 0.8 µm or less. Depending on the width of the trench 6, the n-type impurity is redistributed due to pile-up in a subsequent oxidation step for forming the gate dielectric 7, and the n-type impurity concentration of the epitaxial layer 20d increases in the vicinity of the trench 6, but as the thickness of the gate dielectric 7 is small, there is scarcely any detrimental effect on the advantage of restricting diffusion in a horizontal direction of the p-type impurity region that forms the p-type region 4 of the parallel p-n layer 5. Next, the back surface electrode 13 is formed on the back surface of the semiconductor substrate 1 (epitaxial wafer back surface). Subsequently, the trench gate superjunction semiconductor device shown in FIG. 1 is completed by the epitaxial wafer being diced (cut) into chip form.

The semiconductor device manufacturing method according to the first embodiment is such that it is good when the impurity concentration of the three levels of n-type epitaxial layer 20a to 20c stacked in order to form the parallel p-n layer 5 is in the region of, for example, one-tenth of the impurity concentration of the n-type region 3 of the parallel p-n layer 5. Specifically, in order to achieve a low breakdown voltage class of in the region of 200V or less, it is good when the impurity concentration of the three levels of n$^-$-type epitaxial layer 20a to 20c stacked in order to form the parallel p-n layer 5 is within a range of, for example, $5 \times 10^{15}$/cm$^3$ or more, $1 \times 10^{17}$/cm$^3$ or less. The reason for this is as follows. When the impurity concentration of the epitaxial layers 20a to 20c is less than $5 \times 10^{15}$/cm$^3$, the on-state resistance is 0.9 mΩ·sq or greater, which lacks in practicality. Meanwhile, the higher the impurity concentration of the epitaxial layers 20a to 20c, the further the on-state resistance can be reduced. Also, in the case of a low breakdown voltage class of in the region of 200V or less, an avalanche voltage BVdss is highest when the impurity concentration of the epitaxial layers 20a to 20c is in the vicinity of $1 \times 10^{16}$/cm$^3$, and decreases further the higher the impurity concentration of the epitaxial layers 20a to 20c becomes. Therefore, with the vicinity of $1 \times 10^{16}$/cm$^3$, at which the avalanche voltage BVdss is highest, as a reference, it is preferable that the impurity concentration of the epitaxial layers 20a to 20c is within the heretofore described range in order for both the avalanche voltage BVdss and an on-state resistance RonA to be of optimal values.

Also, although not particularly limiting, when the superjunction semiconductor device according to, for example, the first embodiment is of a low breakdown voltage class of in the region of, for example, 100V, the impurity concentration and thickness of the n-type buffer layer 2, and the impurity concentrations and thicknesses of the parallel p-n layer 5 formed in each of the three levels of epitaxial layer 20a to 20c, have the following values. FIG. 8 is a table showing the impurity concentrations and thicknesses of the parallel p-n layer of the superjunction semiconductor device according to the first embodiment. The impurity concentration and thickness of the n-type buffer layer 2 are $5.2 \times 10^{16}$/cm$^3$ and 1.8 μm respectively. The impurity concentration of the n-type region 3, and the impurity concentration and thickness of the p-type region 4, of the parallel p-n layer 5 formed in the first level epitaxial layer 20a (shown as SJ1 in FIG. 8) are $4.90 \times 10^{16}$/cm$^3$, $4.60 \times 10^{16}$/cm$^3$, and 1.8 μm respectively. The impurity concentration of the n-type region 3, and the impurity concentration and thickness of the p-type region 4, of the parallel p-n layer 5 formed in the second level epitaxial layer 20b (shown as SJ2 in FIG. 8) are $6.00 \times 10^{16}$/cm$^3$, $5.60 \times 10^{16}$/cm$^3$, and 1.6 μm respectively. The impurity concentration of the n-type region 3, and the impurity concentration and thickness of the p-type region 4, of the parallel p-n layer 5 formed in the third level epitaxial layer 20c (shown as SJ3 in FIG. 8) are $6.00 \times 10^{16}$/cm$^3$, $5.50 \times 10^{16}$/cm$^3$, and 2.0 μm respectively.

Figure 5B:
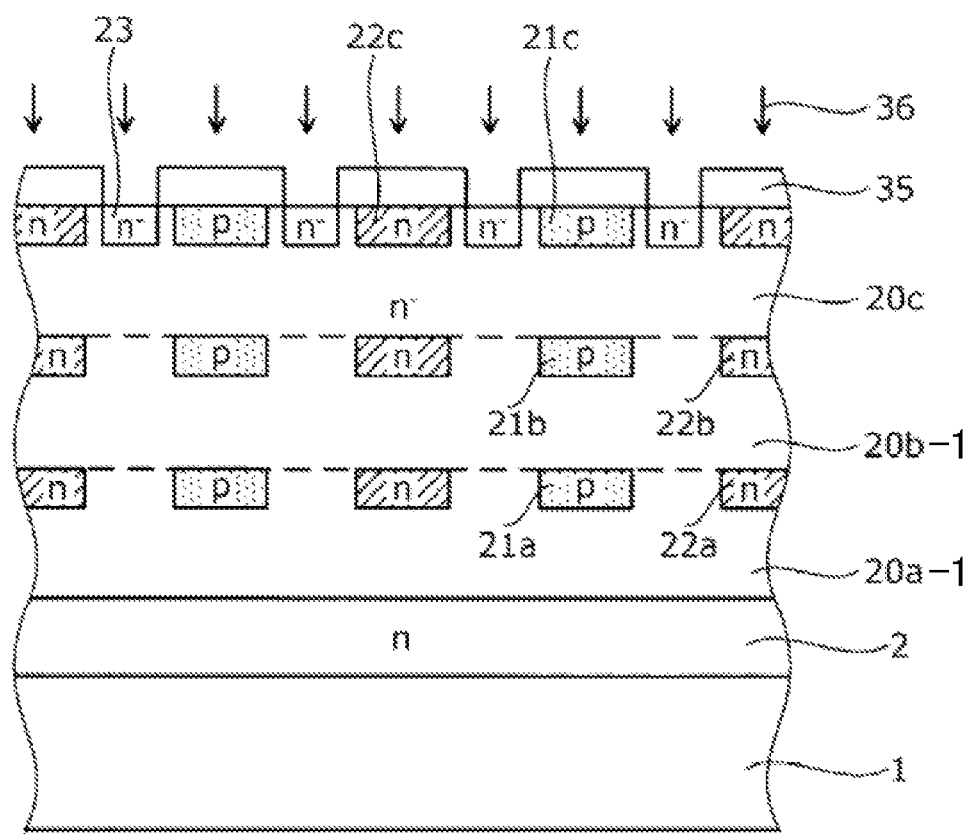

Also, as shown FIG. 5A, the description of the semiconductor device manufacturing method according to the first embodiment has been given with a case wherein all of the first level to third level epitaxial layers 20a to 20c forming the parallel p-n layer 5 are n$^-$-type doped as an example, but it is sufficient that at least the third level epitaxial layer 20c (the uppermost of the multiple levels of epitaxial layer forming the parallel p-n layer 5), which is the layer below the fourth level epitaxial layer 20d configuring the MOS gate structure, is n$^-$-type doped. That is, as shown in FIG. 5B, it is not necessary for the first level and the second level epitaxial layers 20a-1 and 20b-1 (fifth semiconductor layers) to be n$^-$-type doped. The reason for this is that it is at least possible to restrict diffusion in a horizontal direction of the high impurity concentration p-type region 4 at the junction with the p-type base region 9.

As heretofore described, according to the first embodiment, it is possible, by forming an n$^-$-type impurity region using an ion implantation in the vicinity of a p-type impurity region, which forms the p-type region of a parallel p-n layer, formed in an uppermost n$^-$-type epitaxial layer forming the parallel p-n layer, and increasing the n-type impurity concentration of the n$^-$-type epitaxial layer in the vicinity of the p-type impurity region, to restrict diffusion in a horizontal direction of the p-type impurity region formed in the uppermost n$^-$-type epitaxial layer forming the parallel p-n layer at a junction with a p-type base region configuring a MOS gate structure. Therefore, protrusion of the p-type region of the parallel p-n layer onto the n-type region side of the parallel p-n layer can be restricted. Therefore, as the width of the n-type region of the parallel p-n layer in the vicinity of the junction with the p-type base region does not decrease, the path of current flowing from a channel (an inversion layer formed in the p-type base region when in an on-state) toward the back surface electrode does not narrow. Consequently, there is practically no occurrence of an increase in on-state resistance (JFET resistance component) due to the JFET effect. Therefore, by employing a trench gate type, miniaturization is achieved, the channel resistance component and JFET resistance component are reduced, and it is possible to prevent the on-state resistance from increasing. Also, according to the first embodiment, the width of the n-type region of the parallel p-n layer in the vicinity of the junction with the p-type base region does not decrease, because of which it is possible to prevent the charge balance in the parallel p-n layer from breaking down. Therefore, it is possible to prevent the avalanche voltage from decreasing.

Second Embodiment

Figure 9:
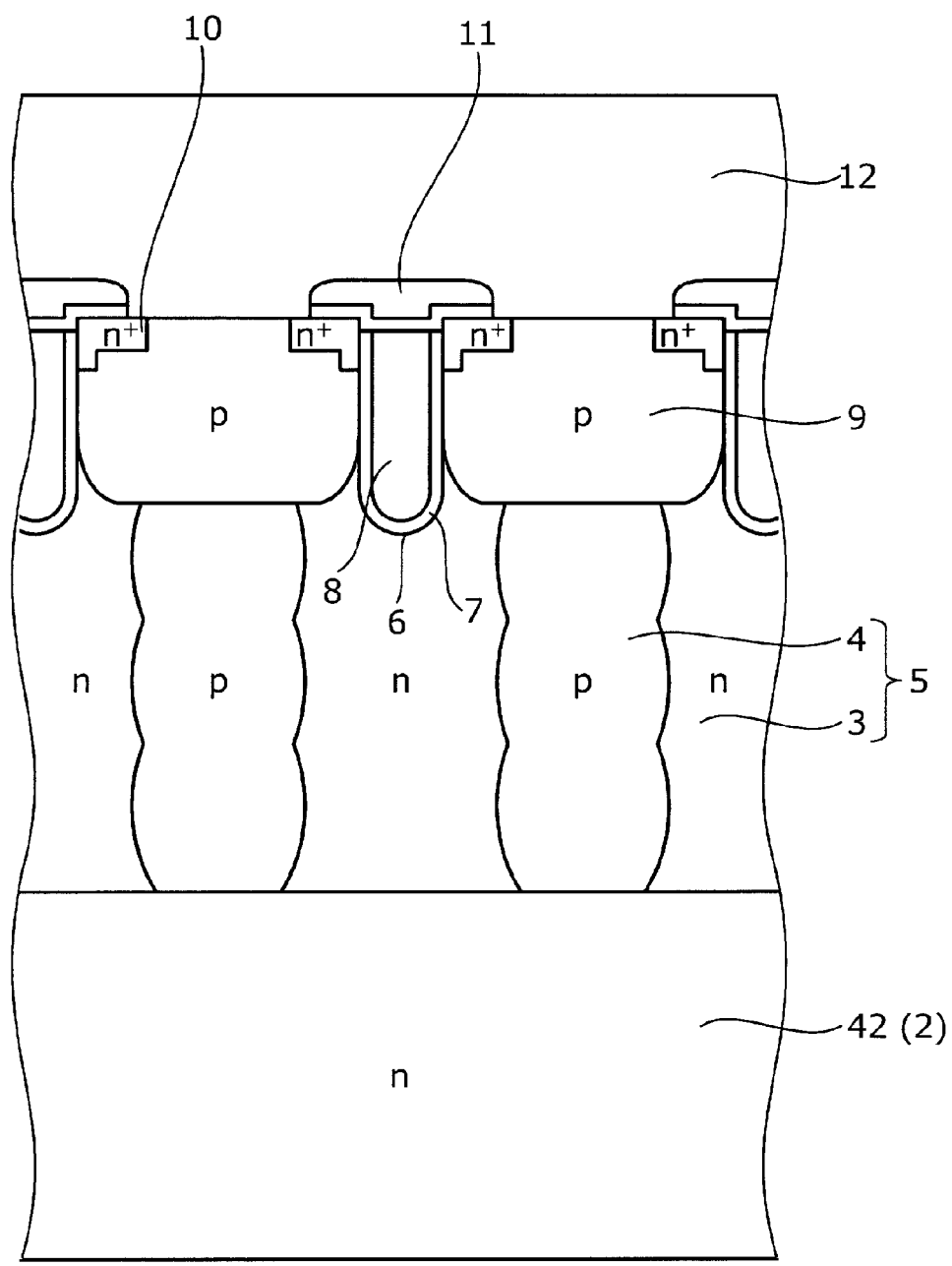
FIG. 9 is a sectional view showing a state partway through the manufacture of a semiconductor device according to a second embodiment.
Figure 10:
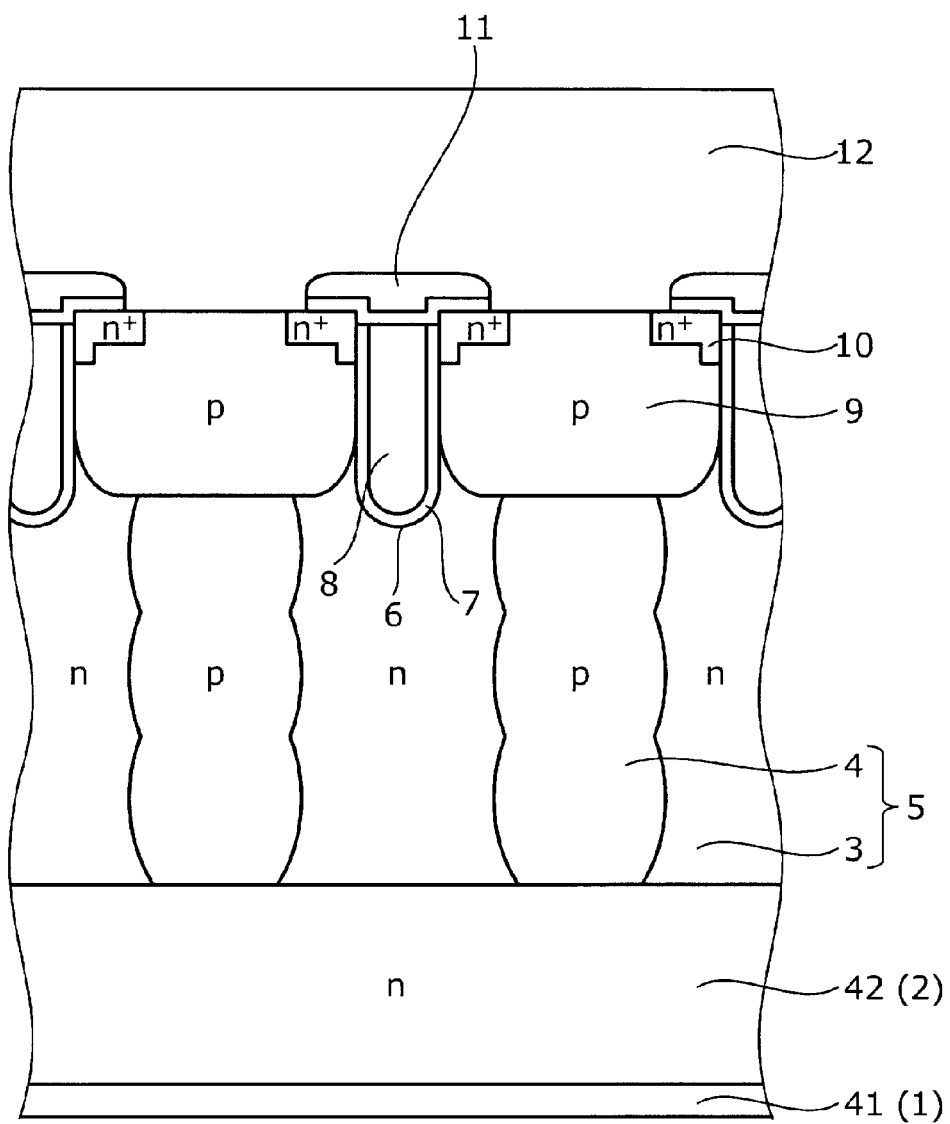
FIG. 10 is a sectional view showing a state partway through the manufacture of the semiconductor device according to the second embodiment.

Next, a description will be given of the semiconductor device manufacturing method according to a second embodiment. FIGS. 9 and 10 are sectional views showing states partway through the manufacture of a semiconductor device according to the second embodiment. The semiconductor device manufacturing method according to the second embodiment differs from the semiconductor device manufacturing method according to the first embodiment in that an n-type semiconductor substrate (that is, a semiconductor substrate on which no epitaxial layers are stacked) 42 having an impurity concentration in the same region as that of the n-type buffer layer 2 is used as a starting substrate (starting wafer).

Specifically, firstly, the n-type semiconductor substrate 42, which has an impurity concentration in the same region as that of the n-type buffer layer 2, is prepared as a starting substrate, as shown in FIG. 9. Next, after the parallel p-n layer 5 is formed on the semiconductor substrate 42 in the same way as in the first embodiment, the unit cell MOS gate structure, front surface electrode 12, and the like, are formed. That is, in the same way as in the first embodiment, the steps from forming the first level epitaxial layer forming the parallel p-n layer 5 (the lowermost of the multiple levels of epitaxial layer forming the parallel p-n layer 5) to forming the unit cell MOS gate structure, front surface electrode 12, and the like, in the fourth level epitaxial layer (the layer above the uppermost of the multiple levels of epitaxial layer forming the parallel p-n layer 5) are carried out sequentially.

Next, as shown in FIG. 10, the semiconductor substrate 42 is ground from the back surface side, whereby the semiconductor substrate 42 is ground to a position of a predetermined thickness (for example, the total thickness of the n-type buffer layer 2 and n$^+$-type drain layer (or p$^+$-type collector layer)). Next, an ion implantation of an n-type impurity (or p-type impurity) is carried out over the whole of the back surface of the semiconductor substrate 42 after grinding, thereby forming an n-type impurity region (or p-type impurity region) 41 that forms the $n^+$-type drain layer (or $p^+$-type collector layer). Next, the n-type impurity region (or p-type impurity region) 41 is caused to diffuse by thermal processing, thereby forming the $n^+$-type drain layer (or $p^+$-type collector layer). Subsequently, the trench gate superjunction semiconductor device shown in FIG. 1 is completed by the formation of the back surface electrode 13 and wafer dicing being carried out sequentially.

As heretofore described, according to the second embodiment, it is possible to obtain the same advantages as in the first embodiment. Also, according to the second embodiment, a superjunction semiconductor device can be fabricated using a low-cost CZ wafer (a silicon wafer fabricated using the Czochralski method) or FZ wafer (a silicon wafer fabricated using the floating zone method) rather than using a high-cost epitaxial wafer.

Third Embodiment

Figure 11:
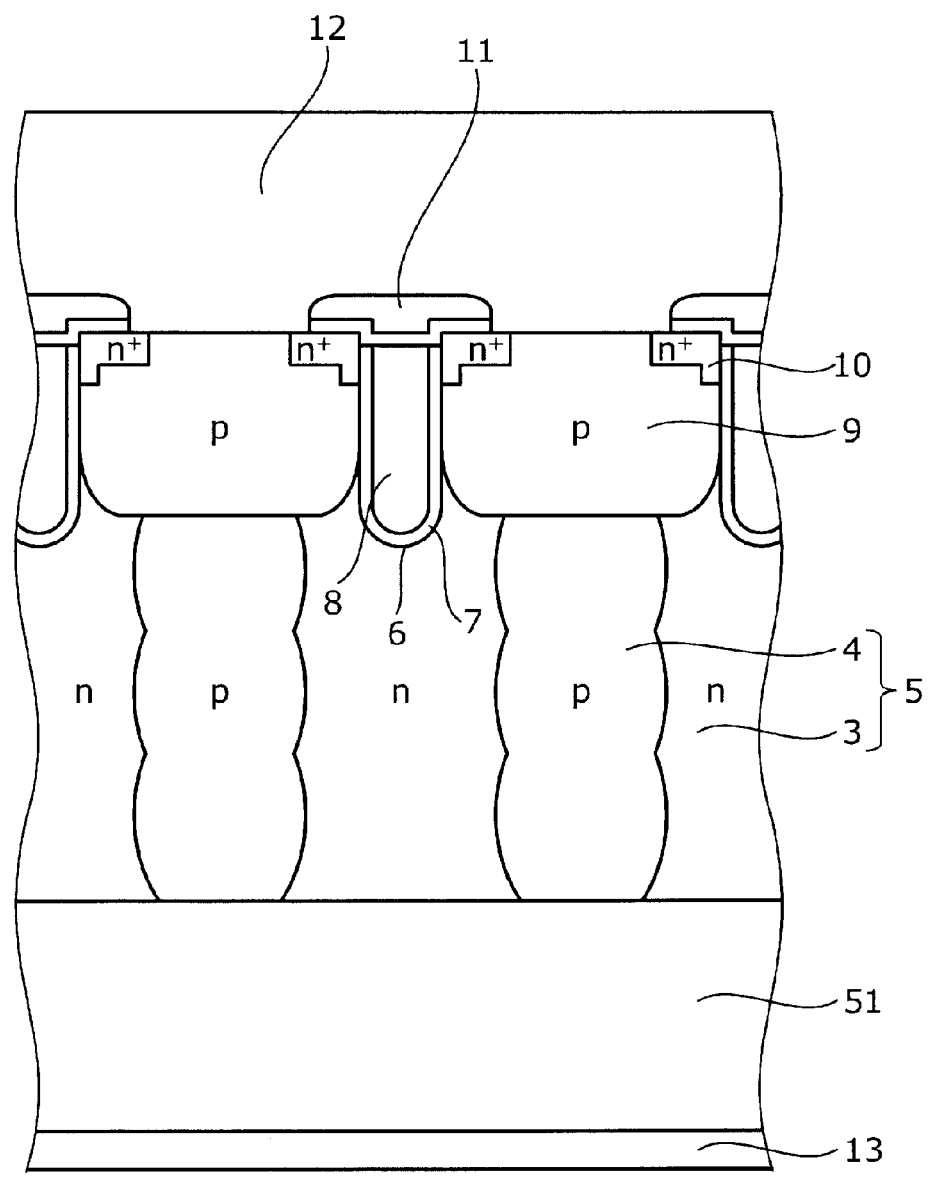
FIG. 11 is a sectional view showing one example of the structure of a semiconductor device according to a third embodiment.
Figure 12:
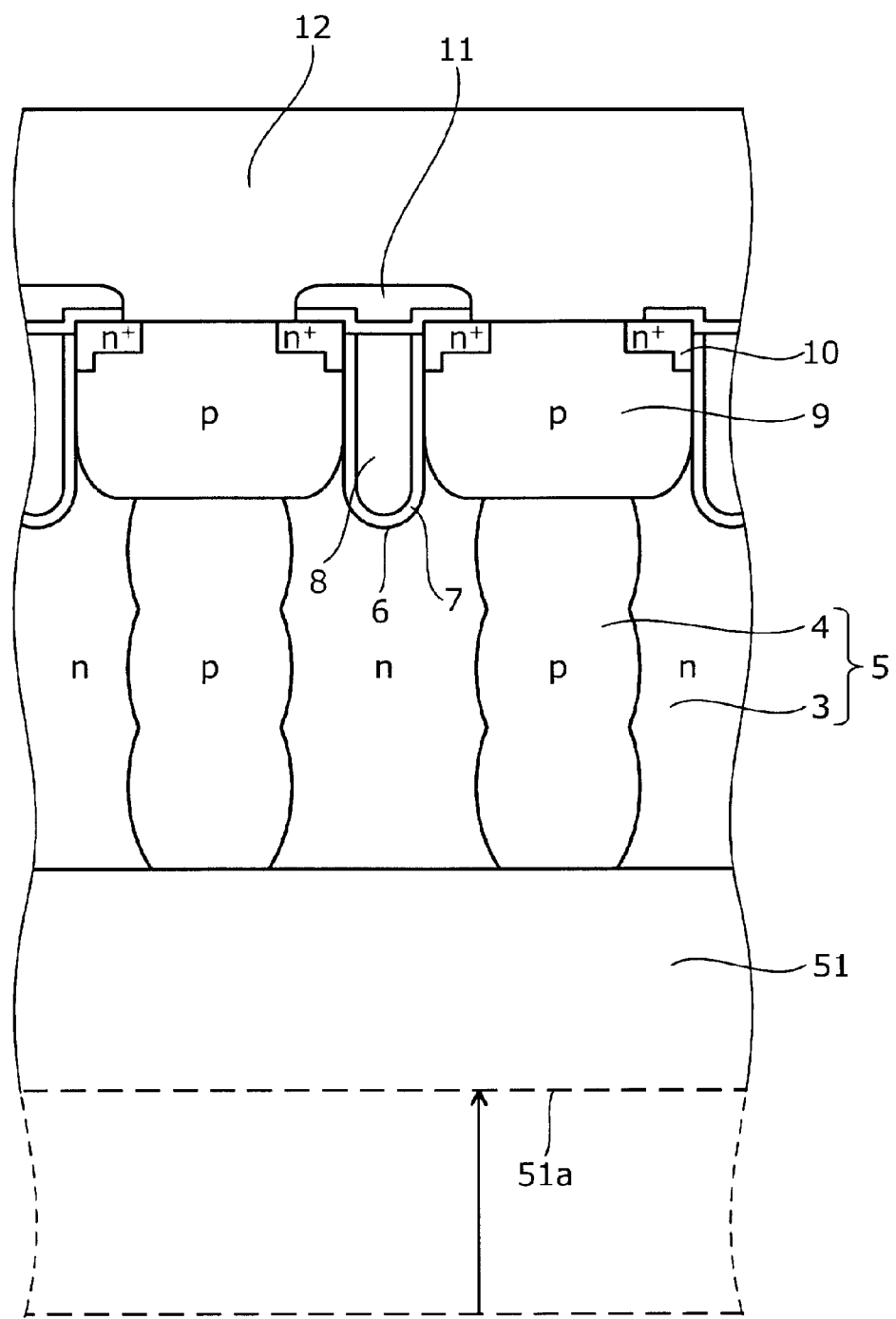
FIG. 12 is a sectional view showing a state partway through the manufacture of the semiconductor device according to the third embodiment.

Next, a description will be given of the semiconductor device manufacturing method according to a third embodiment. FIG. 11 is a sectional view showing one example of the structure of a semiconductor device according to the third embodiment. FIG. 12 is a sectional view showing a state partway through the manufacture of the semiconductor device according to the third embodiment. The semiconductor device manufacturing method according to the third embodiment differs from the semiconductor device manufacturing method according to the second embodiment in that an $n^+$-type (or $p^+$-type) semiconductor substrate 51 having an impurity concentration in the same region as that of the $n^+$-type drain layer (or $p^+$-type collector layer) is used as a starting substrate (starting wafer), and the parallel p-n layer 5 is provided on the front surface of the semiconductor substrate 51. That is, no n-type buffer layer is provided, and the n-type region 3 and p-type region 4 of the parallel p-n layer 5 are both in contact with the semiconductor substrate 51, as shown in FIG. 11.

Specifically, firstly, the $n^+$-type (or $p^+$-type) semiconductor substrate 51 having an impurity concentration in the same region as that of the $n^+$-type drain layer (or $p^+$-type collector layer) is prepared as a starting substrate, as shown in FIG. 12. Next, the steps from forming the first level epitaxial layer forming the parallel p-n layer 5 on the front surface of the semiconductor substrate 51, in the same way as in the second embodiment, to forming the unit cell MOS gate structure, front surface electrode 12, and the like, in the fourth level epitaxial layer are carried out sequentially. That is, it is sufficient that the steps thus far in the third embodiment are such that the step of forming the n-type buffer layer of the semiconductor device manufacturing method according to the first embodiment is omitted. Next, the semiconductor substrate 51 is ground from the back surface side, whereby the semiconductor substrate 51 is ground to a position 51a of a predetermined thickness (for example, the thickness of the $n^+$-type drain layer (or $p^+$-type collector layer)). Subsequently, the trench gate superjunction semiconductor device shown in FIG. 11 is completed by the formation of the back surface electrode 13 and wafer dicing being carried out sequentially.

As heretofore described, according to the third embodiment, it is possible to obtain the same advantages as in the first and second embodiments.

Fourth Embodiment

Figure 13:
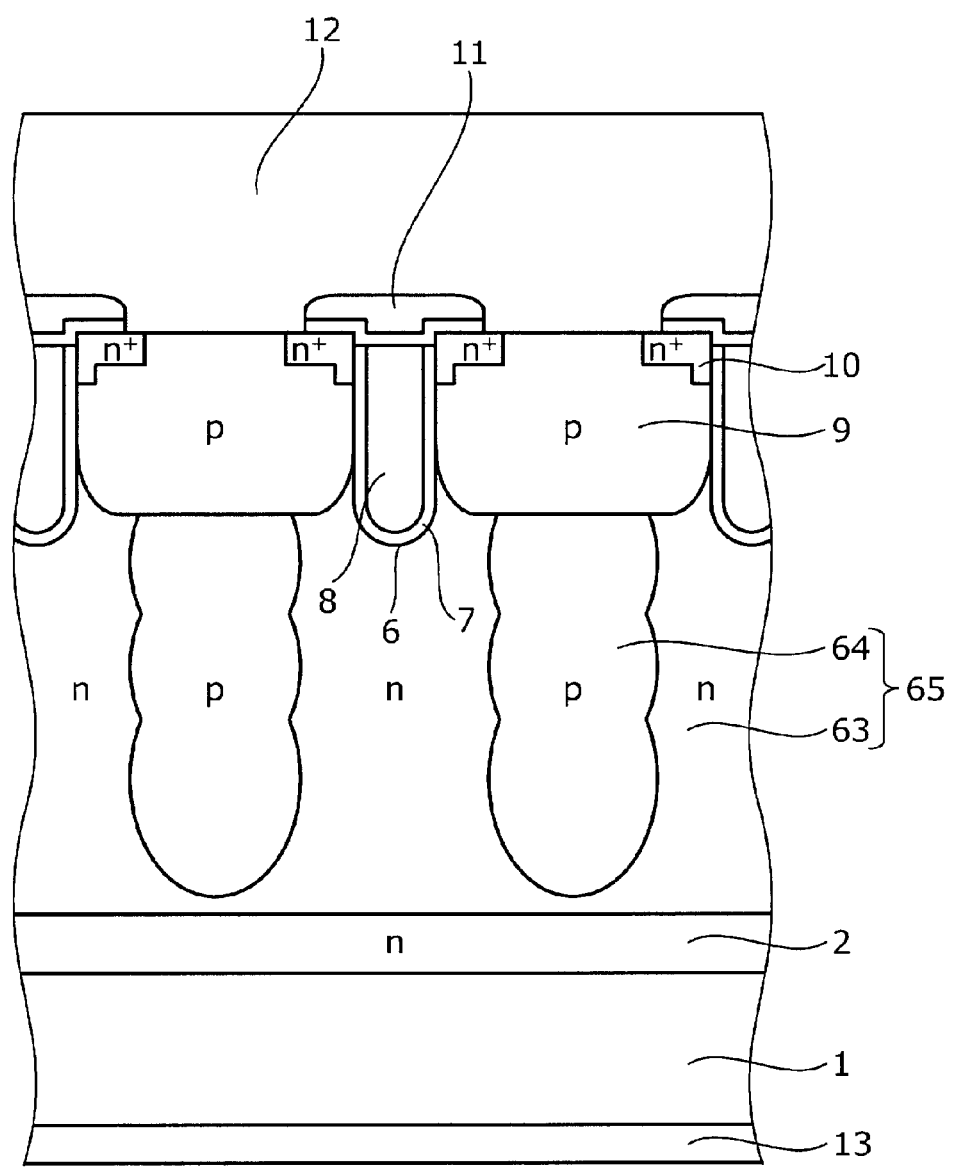
FIG. 13 is a sectional view showing one example of the structure of a semiconductor device according to a fourth embodiment.

Next, a description will be given of the semiconductor device manufacturing method according to a fourth embodiment. FIG. 13 is a sectional view showing one example of the structure of a semiconductor device according to the fourth embodiment. The semiconductor device manufacturing method according to the fourth embodiment differs from the semiconductor device manufacturing method according to the first embodiment in that a p-type region 64 of a parallel p-n layer 65 is provided to a depth not reaching the n-type buffer layer 2. That is, all n-type regions 63 of the parallel p-n layer 65 are joined together on the n-type buffer layer 2 side.

The semiconductor device manufacturing method according to the fourth embodiment is such that, for example, it is sufficient that the conditions in the semiconductor device manufacturing method according to the first embodiment of the ion implantation for forming the p-type impurity region that forms the p-type region 64 in the first level epitaxial layer forming the parallel p-n layer 65 are adjusted (for example, the dose of the ion implantation is adjusted to be lower than in the first embodiment). Configurations of the semiconductor device manufacturing method according to the fourth embodiment other than the method of forming the p-type impurity region forming the p-type region 64 in the first level epitaxial layer that forms the parallel p-n layer 65 are the same as in the first embodiment.

As heretofore described, according to the fourth embodiment, it is possible to obtain the same advantages as in the first to third embodiments.

Fifth Embodiment

Figure 14:
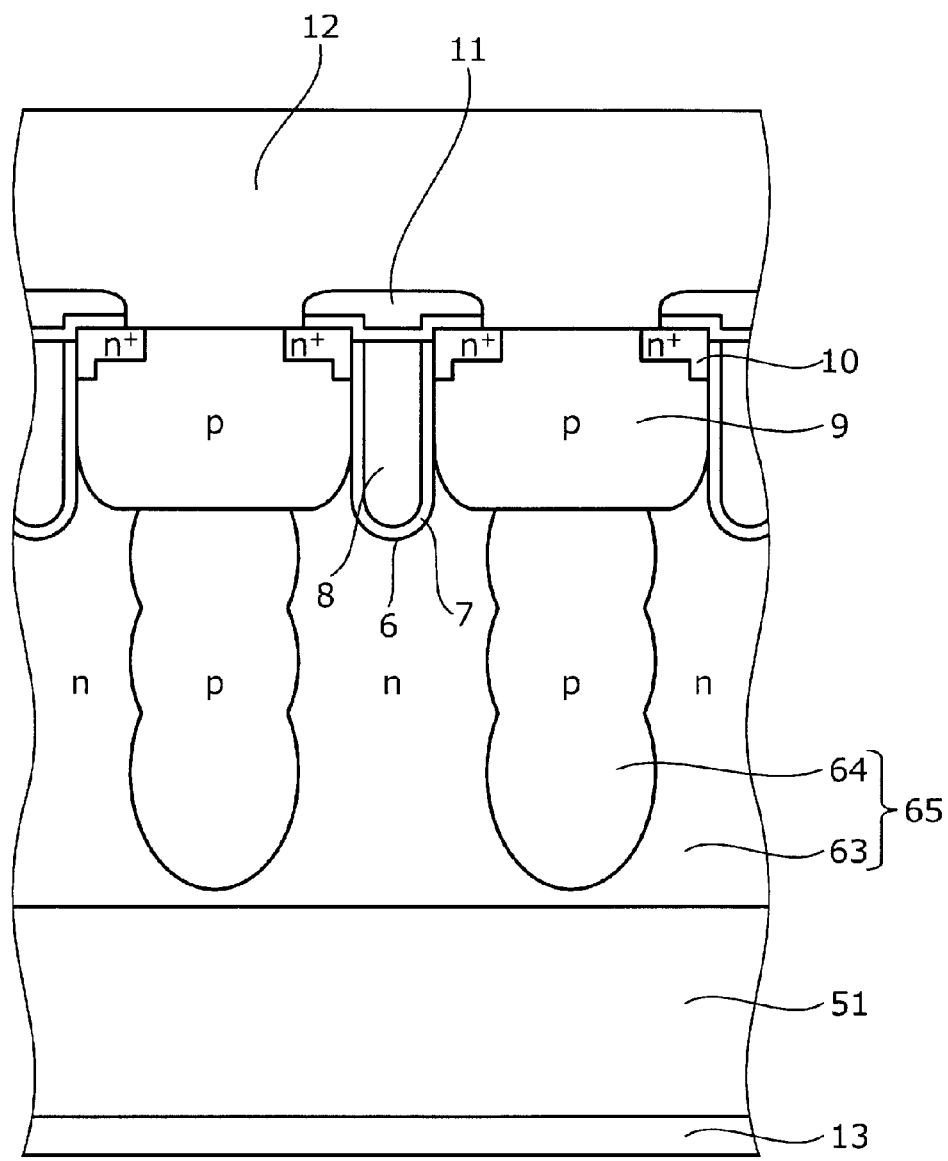
FIG. 14 is a sectional view showing one example of the structure of a semiconductor device according to a fifth embodiment.

Next, a description will be given of the semiconductor device manufacturing method according to a fifth embodiment. FIG. 14 is a sectional view showing one example of the structure of a semiconductor device according to the fifth embodiment. The semiconductor device manufacturing method according to the fifth embodiment differs from the semiconductor device manufacturing method according to the first embodiment in that the p-type region 64 of the parallel p-n layer 65 is provided to a depth not reaching the n-type buffer layer 2. That is, the fifth embodiment is such that the fourth embodiment is applied to the third embodiment.

The semiconductor device manufacturing method according to the fifth embodiment is such that, for example, it is sufficient that the conditions in the semiconductor device manufacturing method according to the third embodiment of the ion implantation for forming the p-type impurity region that forms the p-type region 64 in the first level epitaxial layer forming the parallel p-n layer 65 are adjusted. Configurations of the semiconductor device manufacturing method according to the fifth embodiment other than the method of forming the p-type impurity region that forms the p-type region 64 in the first level epitaxial layer forming the parallel p-n layer 65 are the same as in the third embodiment.

As heretofore described, according to the fifth embodiment, it is possible to obtain the same advantages as in the first to fourth embodiments.

Example 1

Figure 15:
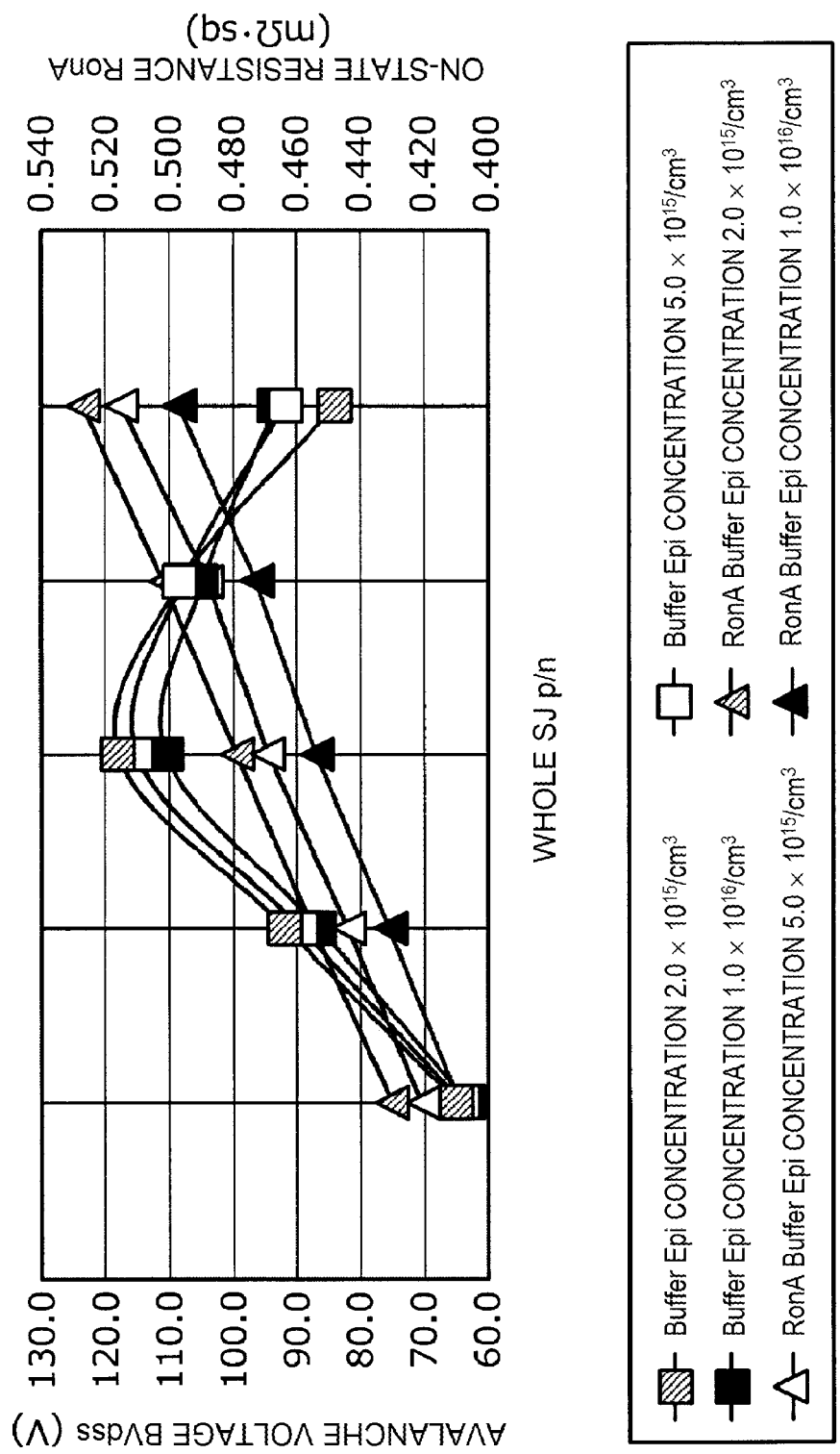
FIG. 15 is a characteristic drawing showing the relationship between the impurity concentration of an n-type buffer layer of a semiconductor device according to Example 1 and avalanche voltage and on-state resistance.

Next, the impurity concentration of the n-type buffer layer 2 is verified. FIG. 15 is a characteristic drawing showing the relationship between the impurity concentration of the n-type buffer layer of a semiconductor device according to Example 1 and the avalanche voltage BVdss and on-state resistance. In FIG. 15, the horizontal axis shows the ratio of the impurity concentration of the p-type region 4 with respect to the impurity concentration of the n-type region 3 of the parallel p-n layer 5 (n-type impurity concentration/p-type impurity concentration, shown as whole SJ p/n in FIG. 15), while the vertical axes show the avalanche voltage BVdss and on-state resistance RonA. Firstly, three samples with differing n-type buffer layer 2 impurity concentrations are fabricated in accordance with the semiconductor device manufacturing method according to the first embodiment (hereafter referred to as Example 1). Example 1 is of a low breakdown voltage class of 100V (the same applies to Example 2). The thickness of the n-type buffer layer 2 is 1.8 µm. The impurity concentration of the n-type buffer layer 2 in each Example 1 is $2.0 \times 10^{15}/cm^3$, $5.0 \times 10^{15}/cm^3$, and $1.0 \times 10^{16}/cm^3$. Conditions of Example 1 other than the n-type buffer layer 2 are the conditions in the case of the low breakdown voltage class of in the region of 100V given as an example in the semiconductor device manufacturing method according to the first embodiment.

The results of measuring the avalanche voltage BVdss (shown as "Buffer Epi Concentration" in FIG. 15) and the results of measuring the on-state resistance (shown as "RonA Buffer Epi Concentration" in FIG. 15) for each Example 1 are shown in FIG. 15. From the results shown in FIG. 15, it is confirmed that the lower the impurity concentration of the n-type buffer layer 2, the further the avalanche voltage BVdss can be increased, with scarcely any dependence on the ratio of the impurity concentration of the p-type region 4 with respect to the impurity concentration of the n-type region 3 of the parallel p-n layer 5 (whole SJ p/n), but the on-state resistance RonA also increases. Therefore, it is preferable that the impurity concentration of the n-type buffer layer 2 is set so that both the avalanche voltage BVdss and on-state resistance RonA are optimal. Also, it can be seen that it is preferable that the impurity concentration of the n-type buffer layer 2 is $5.0 \times 10^{15}/cm^3$ or more, whereby the on-state resistance RonA can be less than 0.9 mΩ·sq.

Example 2

Figure 16:
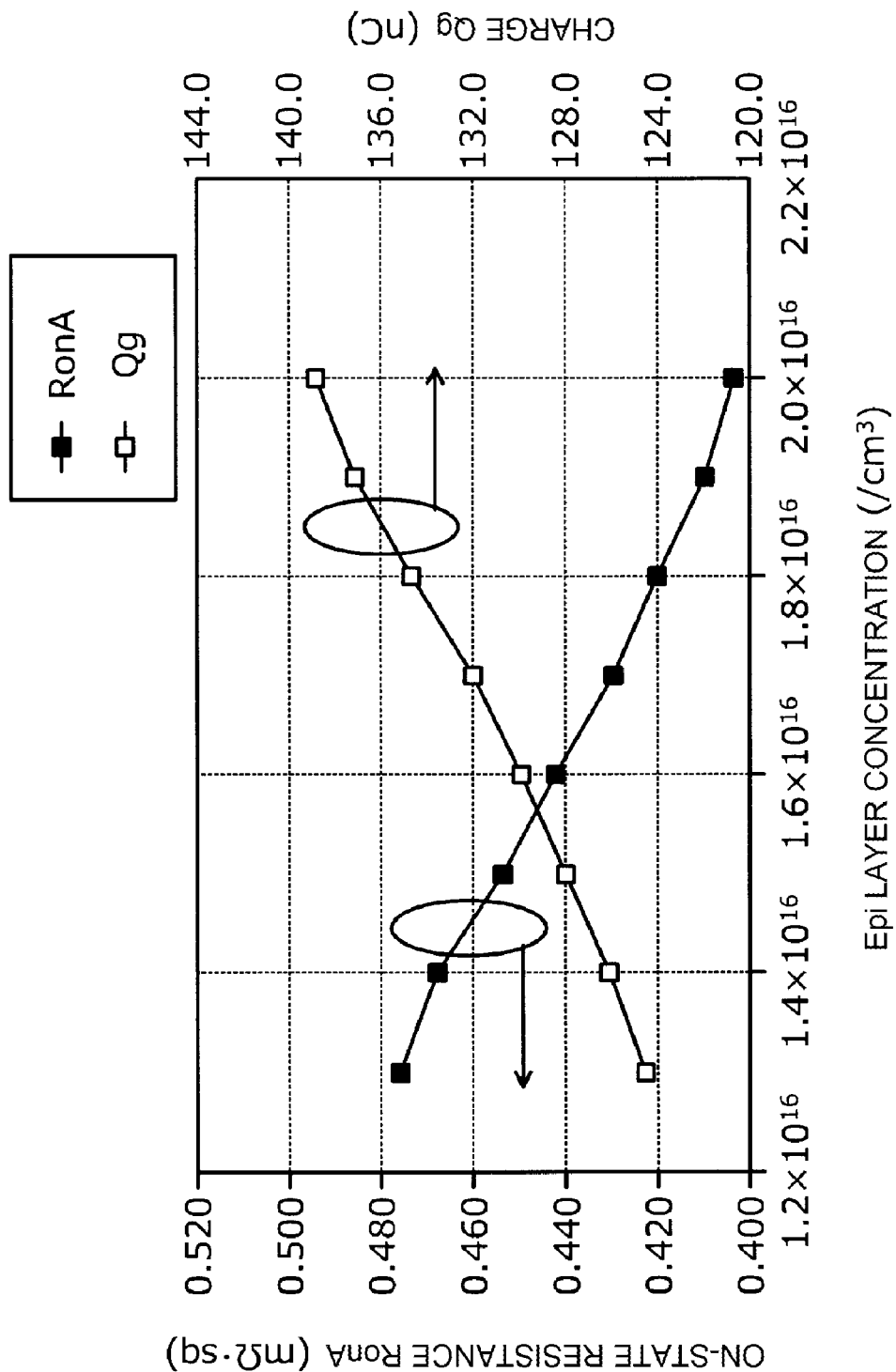
FIG. 16 is a characteristic drawing showing the relationship between the impurity concentration of a parallel p-n layer of a semiconductor device according to Example 2 and on-state resistance and gate input charge.
Figure 17:
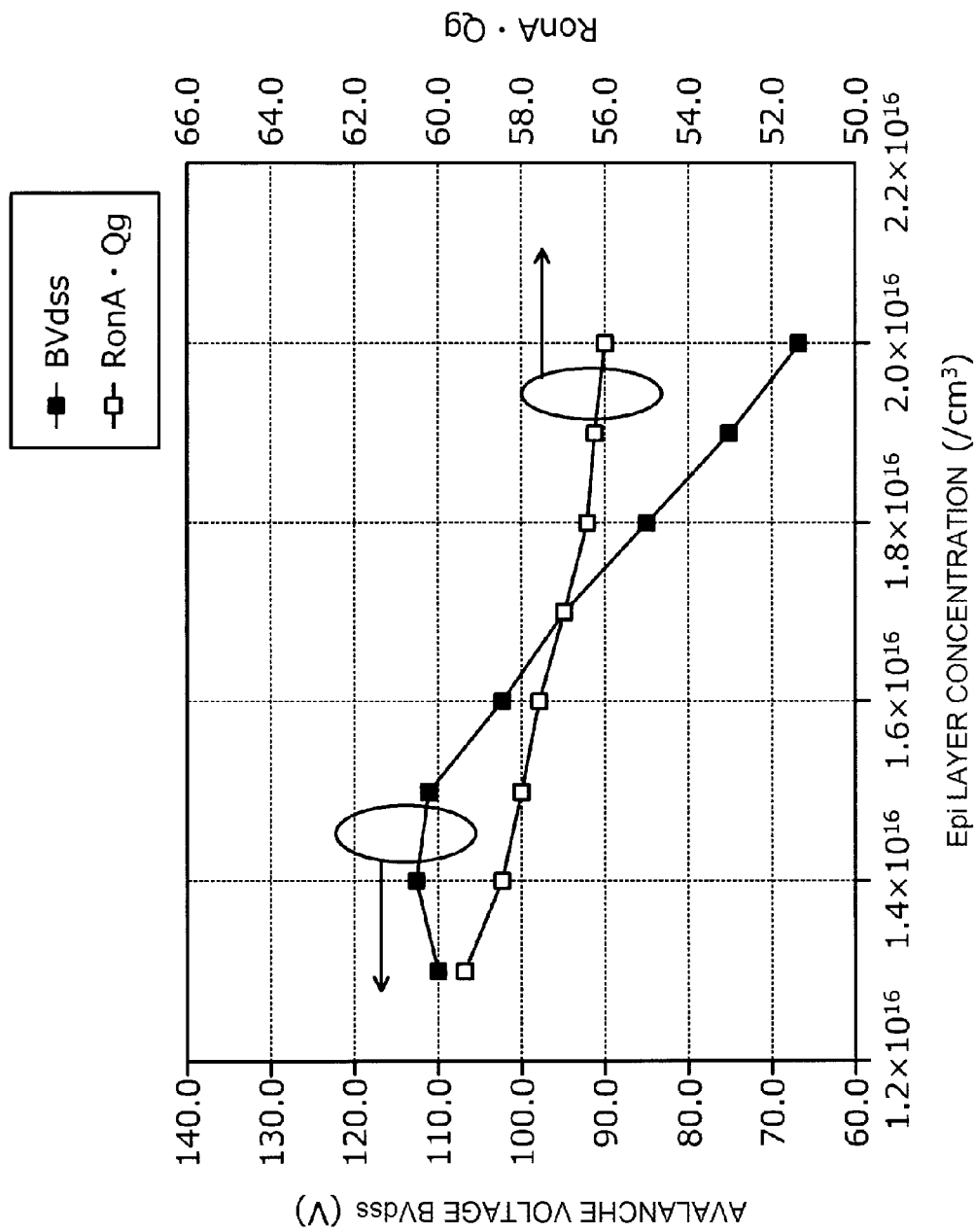
FIG. 17 is a characteristic drawing showing the relationship between the impurity concentration of the parallel p-n layer of the semiconductor device according to Example 2 and the avalanche voltage and RonA·Qg characteristics.
Figure 18:
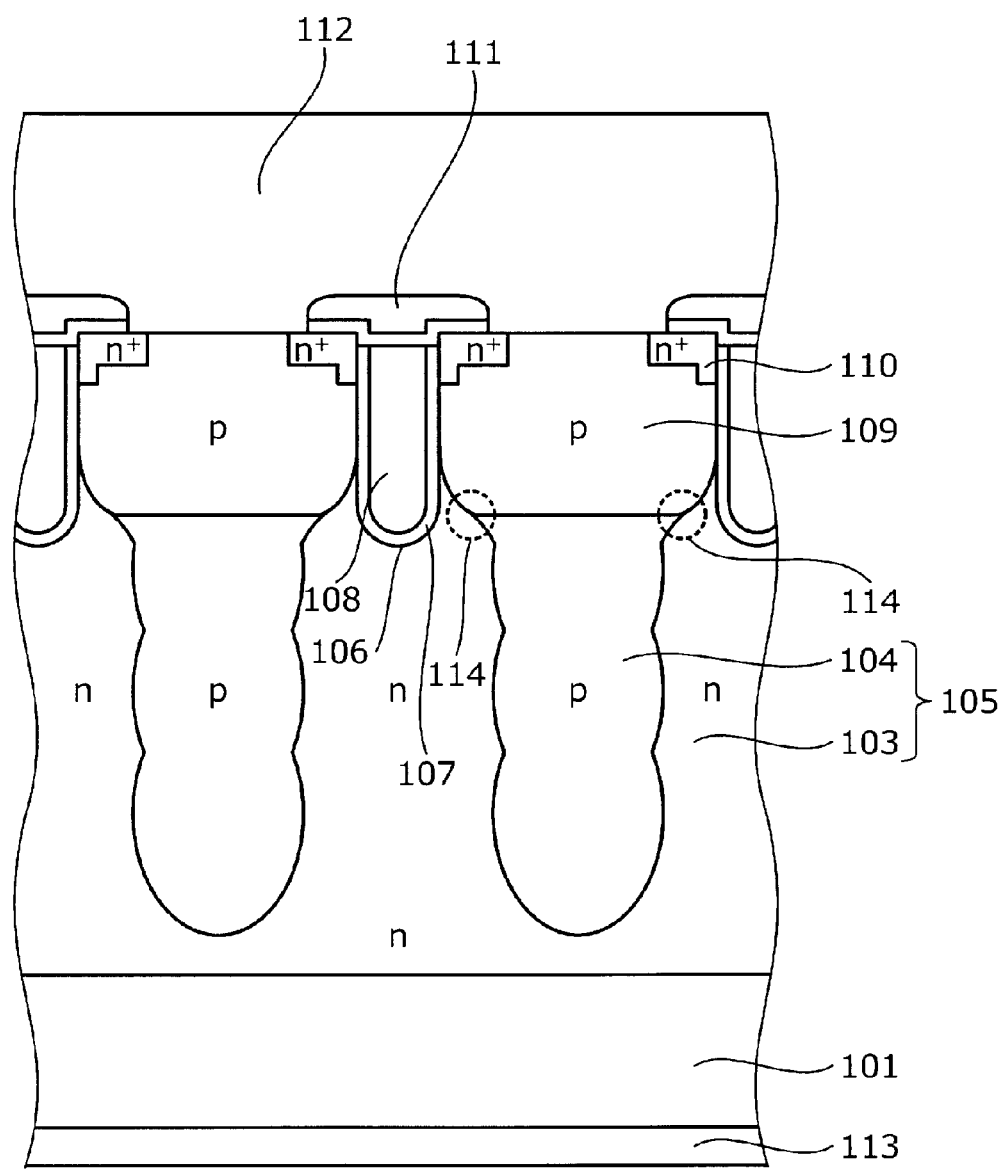
FIG. 18 is a sectional view of the structure of an existing superjunction semiconductor device.
Figure 19:
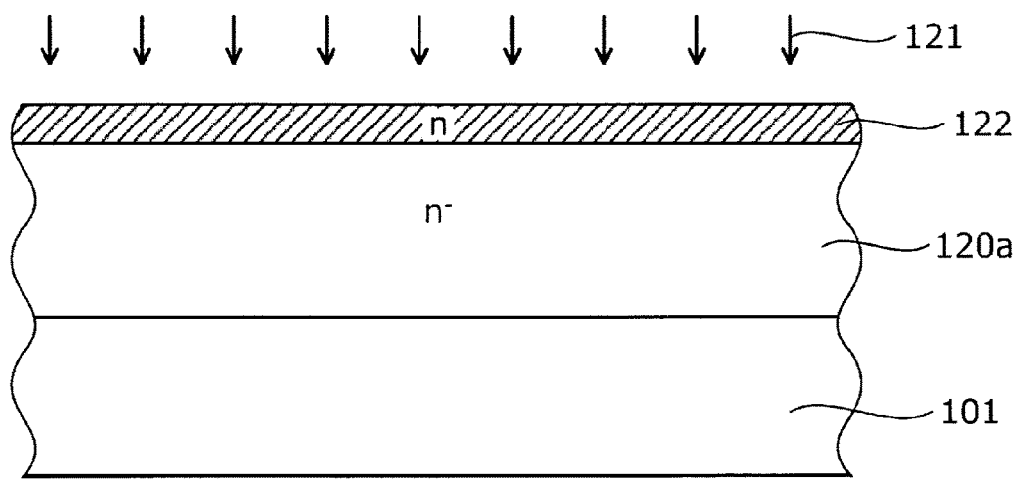
FIG. 19 is a sectional view showing a state partway through the manufacture of the existing superjunction semiconductor device.
Figure 20:
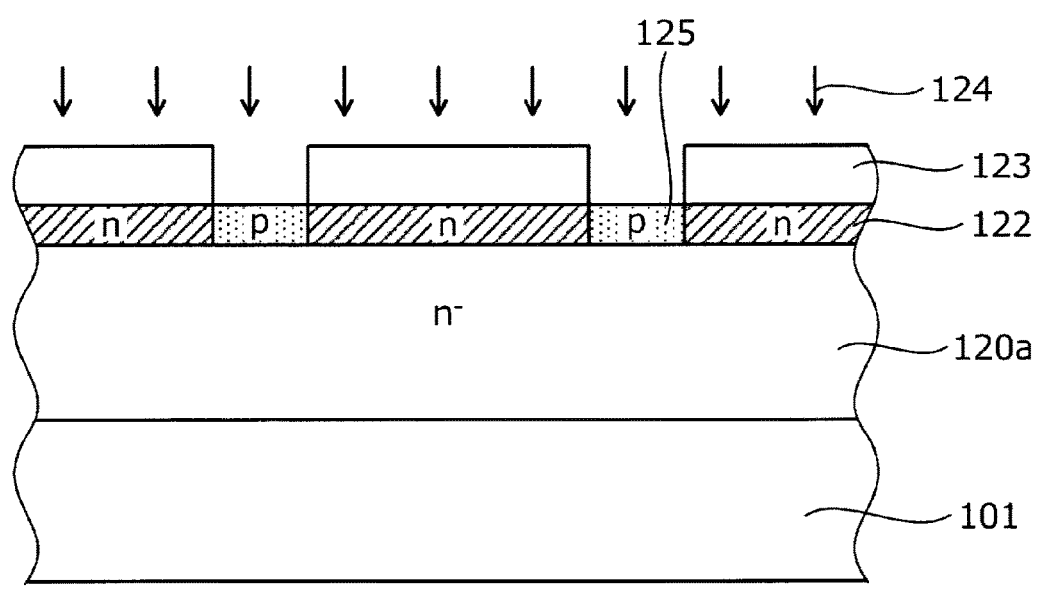
FIG. 20 is a sectional view showing a state partway through the manufacture of the existing superjunction semiconductor device.
Figure 21:
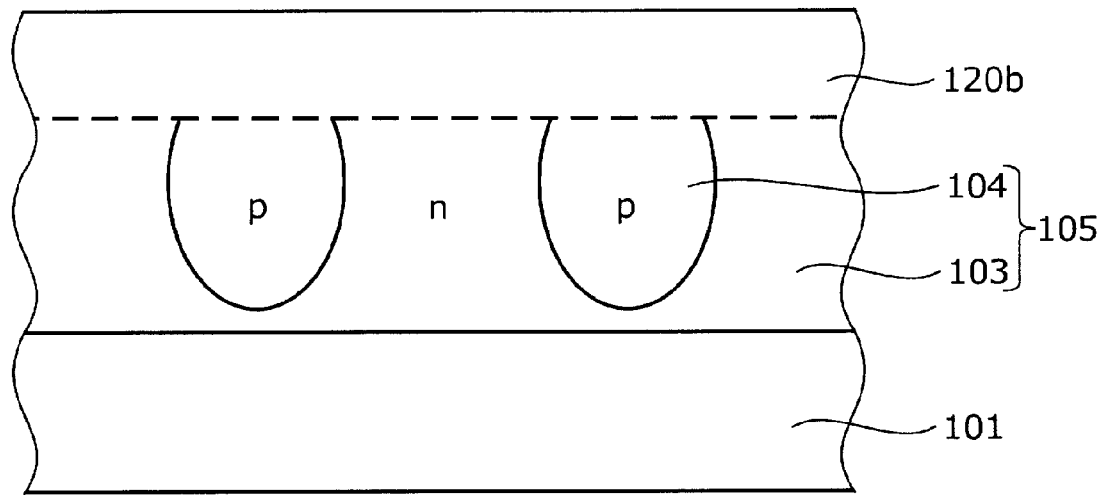
FIG. 21 is a sectional view showing a state partway through the manufacture of the existing superjunction semiconductor device.
Figure 22:
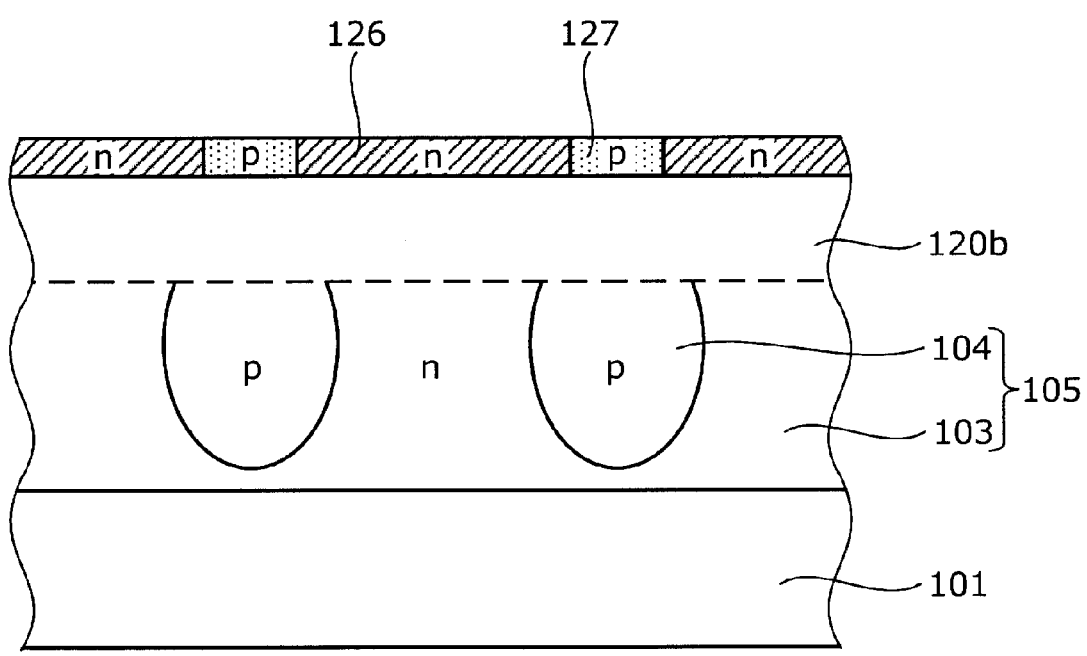
FIG. 22 is a sectional view showing a state partway through the manufacture of the existing superjunction semiconductor device.
Figure 23:
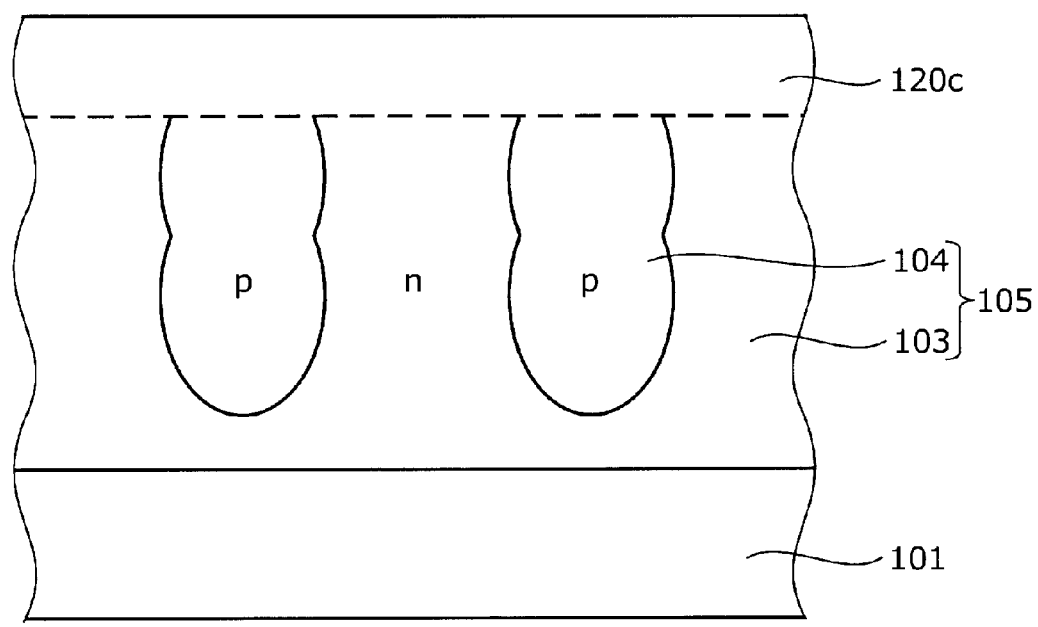
FIG. 23 is a sectional view showing a state partway through the manufacture of the existing superjunction semiconductor device.
Figure 24:
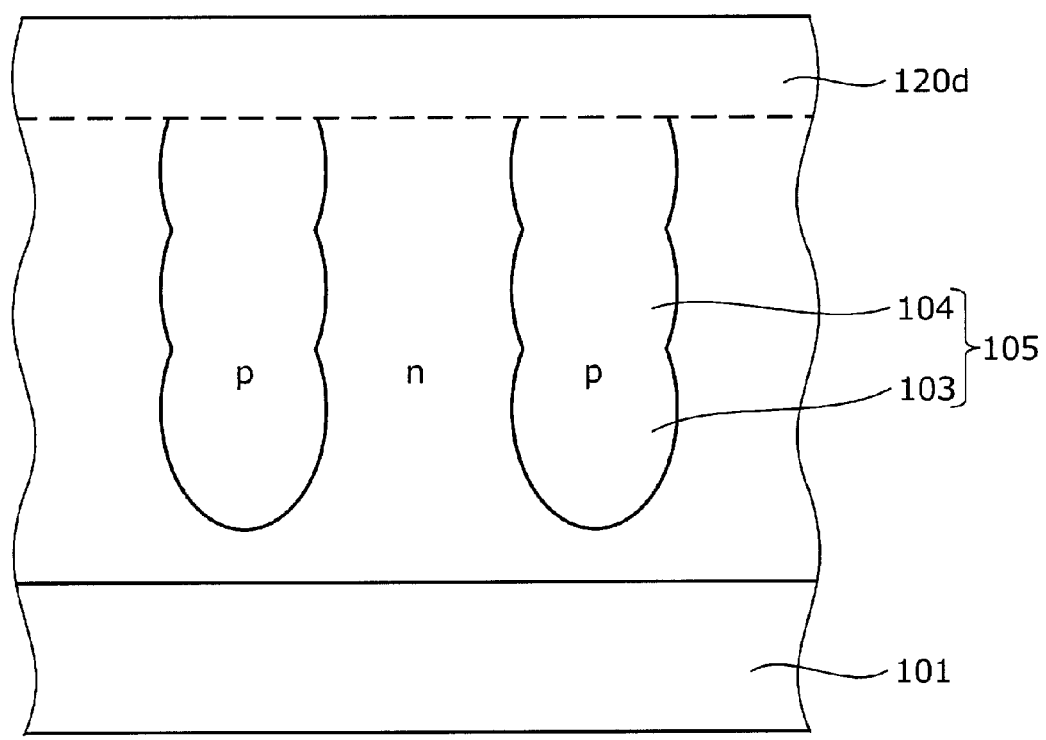
FIG. 24 is a sectional view showing a state partway through the manufacture of the existing superjunction semiconductor device.

Next, the impurity concentration of the $n^-$-type doped multiple epitaxial layers 20a to 20c forming the parallel p-n layer 5 is verified. FIG. 16 is a characteristic drawing showing the relationship between the impurity concentration of the parallel p-n layer of a semiconductor device according to Example 2 and the on-state resistance and gate input charge. FIG. 17 is a characteristic drawing showing the relationship between the impurity concentration of the parallel p-n layer of the semiconductor device according to Example 2 and the avalanche voltage BVdss and RonA·Qg characteristics. FIG. 16 shows the relationship between the impurity concentration of the epitaxial layers 20a to 20c forming the parallel p-n layer 5 and the on-state resistance RonA and gate input charge Qg. FIG. 17 shows the relationship between the impurity concentration of the epitaxial layers 20a to 20c forming the parallel p-n layer 5 and the avalanche voltage BVdss and RonA·Qg characteristics. The RonA·Qg characteristics, being the product of the on-state resistance RonA and gate input charge Qg, are a performance index including the on-state resistance RonA and switching characteristics. Conditions of Example 2 other than the impurity concentration of the epitaxial layers 20a to 20c are the conditions in the case of the low breakdown voltage class of in the region of 100V given as an example in the semiconductor device manufacturing method according to the first embodiment.

From the results shown in FIG. 16, it is confirmed that the further the impurity concentration of the epitaxial layers 20a to 20c is increased, the further the on-state resistance RonA can be reduced. Also, from the results shown in FIG. 17, it is confirmed that the further the impurity concentration of the epitaxial layers 20a to 20c is increased, the further the RonA·Qg characteristics can be improved. Meanwhile, from the results shown in FIG. 17, it is confirmed that the avalanche voltage BVdss is highest when the impurity concentration of the epitaxial layers 20a to 20c is in the vicinity of $1 \times 10^{16}/cm^3$, and decreases further as further the impurity concentration of the epitaxial layers 20a to 20c increases. Therefore, it can be seen that it is preferable that the impurity concentration of the epitaxial layers 20a to 20c is set so that both the avalanche voltage BVdss and on-state resistance RonA are optimal, with the vicinity of $1 \times 10^{16}/cm^3$, at which the avalanche voltage BVdss is highest, as a reference.

Various changes being possible without departing from the scope of the invention, for example, the dimensions, impurity concentrations, and the like, of each portion in the embodiments can be variously set in accordance with required specifications, or the like. Specifically, for example, it is sufficient that the impurity concentration of the epitaxial layers is increased when adopting a voltage breakdown class lower than 100V, the impurity concentration of the epitaxial layers is reduced when adopting a voltage breakdown class higher than 100V, the number of levels of epitaxial layer is changed, or the like. Also, in the embodiments, a description has been given with a superjunction structure wherein the drift layer is a parallel p-n layer as an example but, this not being limiting, the invention is also applicable to a semiconductor device (for example, an RC-IGBT) including a structure wherein an n-type region and p-type region are disposed so as to be in contact with each other in a horizontal direction. Also, in the embodiments, a description has been given taking as an example a case wherein an $n^-$-type counter region is formed in the uppermost epitaxial layer of multiple epitaxial layers forming a parallel p-n layer, but an $n^-$-type counter region may also be formed in an epitaxial layer other than the uppermost of the multiple epitaxial layers forming the parallel p-n layer, in the same way as in the uppermost epitaxial layer. Also, in the embodiments, the first-conductivity-type is n-type and the second-conductivity-type is p-type, but the invention is established in the same way when the first-conductivity-type is p-type and the second-conductivity-type is n-type. That is, when the semiconductor device is a p-channel superjunction semiconductor device, it is possible to restrict diffusion in a horizontal direction of the n-type region of the parallel p-n layer at a junction with an n-type base region. When the semiconductor device is a p-channel superjunction semiconductor device, the impurity concentration and thickness of a p-type buffer layer may be $4.3 \times 10^{16}/cm^3$ and 1.8 µm respectively.

As heretofore described, the semiconductor device manufacturing method according to the invention is useful in a superjunction semiconductor device of a low breakdown voltage class in the region of, for example, 200V or less.

What is claimed is:
1. A method of manufacturing a semiconductor device including a parallel p-n layer wherein a first-conductivity-type semiconductor region and a second-conductivity-type semiconductor region are repeatedly and alternately disposed, the semiconductor device manufacturing method comprising:

performing a first formation step by:
depositing a first-conductivity-type first semiconductor layer, in a first deposition step;
selectively introducing a first-conductivity-type impurity and a second-conductivity-type impurity into the first semiconductor layer, thereby repeatedly and alternately forming a first first-conductivity-type impurity region and a second-conductivity-type impurity region in a surface region of the first semiconductor layer, in a first introduction step, and repeatedly carrying out the first deposition step and the first introduction step; and
forming the parallel p-n layer by causing the first-conductivity-type impurity of the first first-conductivity-type impurity region and the second-conductivity-type impurity of the second-conductivity-type impurity region to diffuse using thermal processing, wherein
the first formation step further includes selectively introducing, into an uppermost one of the first semiconductor layers, the first-conductivity-type impurity into an area between adjacent ones of the first first-conductivity-type impurity region and the second-conductivity-type impurity region, thereby increasing the first-conductivity-type impurity concentration on respective sides of the second-conductivity-type impurity region, in the uppermost one of the first semiconductor layers, in a second introduction step.

2. The semiconductor device manufacturing method according to claim 1, wherein an impurity concentration of the second first-conductivity-type impurity region is higher than an impurity concentration of the first semiconductor layer, the first-conductivity-type impurity of the second first-conductivity-type impurity region restricting diffusion of the second-conductivity-type impurity of the second-conductivity-type semiconductor region toward the first first-conductivity-type impurity region side due to the thermal processing.

3. The semiconductor device manufacturing method according to claim 2, wherein the first first-conductivity-type impurity region and second-conductivity-type impurity region in at least the uppermost one of the first semiconductor layers are separated from each other after the first introduction step is carried out on the uppermost one of the first semiconductor layers.

4. The semiconductor device manufacturing method according to claim 2, wherein, the first introduction step further comprises selectively introducing by ion implantation into the first semiconductor layer, to thereby form the second-conductivity-type impurity region in the uppermost one of the first semiconductor layers, a dose and acceleration energy of the ion implantation being set so that a depth of the second-conductivity-type impurity region is between one-tenth or more, and one-half or less, of a depth of the first semiconductor layer.

5. The semiconductor device manufacturing method according to claim 1, wherein the first first-conductivity-type impurity region and second-conductivity-type impurity region in at least the uppermost one of the first semiconductor layers are separated from each other after the first introduction step is carried out on the uppermost one of the first semiconductor layers.

6. The semiconductor device manufacturing method according to claim 5, wherein, the first introduction step further comprising selectively introducing by ion implantation into the first semiconductor layer, to thereby form the second-conductivity-type impurity region in the uppermost one of the first semiconductor layers, a dose and acceleration energy of the ion implantation being set so that a depth of the second-conductivity-type impurity region is between one-tenth or more, and one-half or less, of a depth of the first semiconductor layer.

7. The semiconductor device manufacturing method according to claim 1, wherein, the first introduction step further comprises selectively introducing by ion implantation into the first semiconductor layer, to thereby form the second-conductivity-type impurity region in the uppermost one of the first semiconductor layers, a dose and acceleration energy of the ion implantation being set so that a depth of the second-conductivity-type impurity region is between one-tenth or more, and one-half or less, of a depth of the first semiconductor layer.

8. The semiconductor device manufacturing method according to claim 1, wherein an impurity concentration of the first semiconductor layer is between $5 \times 10^{15}/cm^3$ or more, and $1 \times 10^{17}/cm^3$ or less.

9. The semiconductor device manufacturing method according to claim 1, wherein
the first semiconductor layer is deposited in the first deposition step on a first-conductivity-type second semiconductor layer having an impurity concentration higher than that of the first-conductivity-type semiconductor region, and having an impurity concentration between $5 \times 10^{15}/cm^3$ or more, and $1 \times 10^{17}/cm^3$ or less, and
the method further including:
grinding the second semiconductor layer from a side opposite to a first semiconductor layer side after performing the thermal processing; and
introducing an impurity into the second semiconductor layer from a ground surface side of the second semiconductor layer, to thereby form a first-conductivity-type or second-conductivity-type third semiconductor layer, an impurity concentration of the third semiconductor layer being higher than the impurity concentration of the second semiconductor layer in a second formation step.

10. The semiconductor device manufacturing method according to claim 9, wherein the impurity concentration of the third semiconductor layer is between $1 \times 10^{15}/cm^3$ or more, and $1 \times 10^{18}/cm^3$ or less.

11. The semiconductor device manufacturing method according to claim 1, wherein
the first deposition step includes depositing the first semiconductor layer on a first-conductivity-type another semiconductor layer, an impurity concentration of the other semiconductor layer being higher than an impurity concentration of the first-conductivity-type semiconductor region, and being between $1 \times 10^{15}/cm^3$ or more, and $1 \times 10^{18}/cm^3$ or less, and
the method further including:
grinding the other semiconductor layer from a side opposite to the first semiconductor layer after performing the thermal processing.

12. The semiconductor device manufacturing method according to claim 1, further comprising:
depositing a first-conductivity-type second semiconductor layer on the first semiconductor layer after the first formation step; and forming an element having an insulated gate structure formed of metal-oxide-semiconductor in the second semiconductor layer in an element structure formation step, wherein the element structure formation step includes diffusing a semiconductor region in which a channel is formed, and the thermal processing is carried out simultaneously with the diffusing step included in the element structure formation step.

13. The semiconductor device manufacturing method according to claim 1, wherein, the first formation step further includes:

depositing another semiconductor layer, in a second deposition step;

selectively introducing the first-conductivity-type impurity and the second-conductivity-type impurity into the other semiconductor layer, thereby repeatedly and alternately disposing the first first-conductivity-type impurity region and second-conductivity-type impurity region in a surface region of the other semiconductor layer, in a third introduction step; and repeatedly carrying out the second deposition step and the third introduction step before the first deposition step, wherein repetition of the first deposition step and first introduction step is carried out at least once after the third introduction step, to thereby form the first semiconductor layer on an uppermost level.

14. A method of manufacturing a semiconductor, comprising:

forming a semiconductor layer as a first layer;

selectively introducing a first-conductivity-type impurity and a second-conductivity-type impurity into the first layer to form a plurality of first injection areas and a plurality of second injection areas, respectively, each first injection area and each second injection area being disposed alternately and in parallel in the first layer;

forming a semiconductor layer of the first-conductivity-type as a second layer;

selectively introducing the first-conductivity-type impurity and the second-conductivity-type impurity into the second layer to form a plurality of first injection areas and a plurality of second injection areas, respectively, each first injection area and each second injection area being disposed alternately and in parallel in the second layer, adjacent injection areas having an interval therebetween;

further introducing the first-conductivity-type impurity into the interval between the adjacent injection areas in the second layer; and forming a plurality of first-conductivity-type semiconductor regions and a plurality of second-conductivity-type semiconductor regions by diffusing the first-conductivity-type impurity and the second-conductivity-type impurity of the injection areas by performing a thermal processing, each first-conductivity-type semiconductor region and each second-conductivity-type semiconductor region being formed alternatively and in parallel in the first and second layers.

15. The semiconductor device manufacturing method according to claim 14, further comprising:

forming a semiconductor layer of the first-conductivity-type as a third layer; and selectively introducing the first-conductivity-type impurity and the second-conductivity-type impurity into the third layer to be impurity diffusion regions of an element having a metal oxide semiconductor structure, wherein, in the thermal processing, the impurity diffusion regions in the third layer, and each first-conductivity-type semiconductor region and each second-conductivity-type semiconductor region in the first and second layers are formed at the same time by diffusing the first-conductivity-type impurity and the second-conductivity-type impurity in the first to third layers.

16. The semiconductor device manufacturing method according to claim 14, wherein a concentration of the first-conductivity-type impurity in the interval between the adjacent injection areas in the second layer is between a concentration of the first-conductivity-type impurity in the second layer and a concentration of the first-conductivity-type impurity in the first injection area of the second layer.

17. The semiconductor device manufacturing method according to claim 14, wherein adjacent injection areas have an interval in the first layer.

18. The semiconductor device manufacturing method according to claim 14, wherein the first layer has the first-conductivity-type.

* * * * *